US012684931B2

(12) United States Patent
Zhao et al.

(10) Patent No.: US 12,684,931 B2
(45) Date of Patent: Jul. 14, 2026

(54) DISPLAY PANEL AND DISPLAY DEVICE

(71) Applicant: Wuhan Tianma Micro-Electronics Co., Ltd., Wuhan (CN)

(72) Inventors: Xu Zhao, Wuhan (CN); Xianchi Wang, Wuhan (CN); Dan Huang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 656 days.

(21) Appl. No.: 17/968,579

(22) Filed: Oct. 18, 2022

(65) Prior Publication Data

US 2023/0420625 A1 Dec. 28, 2023

(30) Foreign Application Priority Data

Jun. 28, 2022 (CN) .......................... 202210751091.7

(51) Int. Cl.
| | |
|---|---|
| *H10H 29/49* | (2025.01) |
| *H10H 20/857* | (2025.01) |
| *H10H 29/14* | (2025.01) |
| *H10H 29/24* | (2025.01) |
| *H10H 29/80* | (2025.01) |
| *H10W 20/20* | (2026.01) |
| *H10W 90/00* | (2026.01) |

(52) U.S. Cl.
CPC .......... *H10H 29/49* (2025.01); *H10H 20/857* (2025.01); *H10H 29/142* (2025.01); *H10H 29/24* (2025.01); *H10H 29/832* (2025.01); *H10H 29/962* (2025.01); *H10W 20/20* (2026.01); *H10W 90/00* (2026.01); *H10W 90/701* (2026.01); *H10W 90/794* (2026.01)

(58) Field of Classification Search
None
See application file for complete search history.

(56) References Cited

U.S. PATENT DOCUMENTS

| | | | | |
|---|---|---|---|---|
| 10,193,042 B1 * | 1/2019 | Tsai | ..................... | H10H 20/856 |
| 2003/0141506 A1 * | 7/2003 | Sano | ..................... | H10H 20/84 |
| | | | | 257/E33.068 |

(Continued)

FOREIGN PATENT DOCUMENTS

| | | |
|---|---|---|
| CN | 111312742 A | 6/2020 |
| CN | 113851489 A | 12/2021 |
| CN | 114613733 A | 6/2022 |

*Primary Examiner* — Feifei Yeung Lopez
(74) *Attorney, Agent, or Firm* — Anova Law Group, PLLC

(57) ABSTRACT

A display panel and a display device are provided. The display panel includes a substrate; light-emitting devices, pad groups on a side of the substrate, and first metal elements and second metal elements at a side of the pad groups close to the substrate. Each pad group includes a first pad and a second pad, and at least one pad group corresponds to one light-emitting device. In one pad group corresponding to one same light-emitting device, along a direction perpendicular to a plane of the substrate, the first pad at least partially overlaps the first metal elements with an overlapping area of S1 and the second pad at least partially overlaps the second metal elements with an overlapping area of S2 where |S1−S2|/S1≤5%, or the first pad does not overlap the first metal elements and the second pad does not overlap the second metal elements.

18 Claims, 26 Drawing Sheets

(56) References Cited

U.S. PATENT DOCUMENTS

| | | | |
|---|---|---|---|
| 2009/0159902 A1* | 6/2009 | Yasuda ................ | H10H 20/831 |
| | | | 257/E33.057 |
| 2017/0179097 A1* | 6/2017 | Zhang ................. | H10H 29/142 |
| 2019/0305199 A1* | 10/2019 | Li ....................... | H01L 25/0753 |
| 2020/0161282 A1* | 5/2020 | Kang ................... | H01L 25/0753 |
| 2020/0365664 A1* | 11/2020 | Jeon .................... | H10K 59/121 |
| 2021/0028156 A1* | 1/2021 | Kang ................. | H01L 25/0753 |
| 2021/0066648 A1* | 3/2021 | Chung ................. | H10K 59/122 |

* cited by examiner

DISPLAY PANEL AND DISPLAY DEVICE

CROSS-REFERENCE TO RELATED APPLICATION

This application claims the priority of Chinese Patent Application No. 202210751091.7, filed on Jun. 28, 2022, the content of which is incorporated herein by reference in its entirety.

TECHNICAL FIELD

The present disclosure generally relates to the field of display technologies and, more particularly, relates to a display panel and a display device.

BACKGROUND

As electronic products such as mobile phones, computers and TVs are widely used in all aspects of life, electronic displays such as display panels are widely used. Among them, micro light-emitting diode (Micro LED) technology and mini light-emitting diode (Mini LED) technology are new display technologies, and have self-luminous display characteristics. They have advantages of all-solid-state, long life, high brightness, low power consumption, small size, ultra-high resolution, and capability to be used in extreme environments such as high temperature or radiation, and have a good application prospect correspondingly. Micro LED/Mini LED technology are LED miniaturization and matrix technologies, which refers to the technologies of integrating a high-density micro-sized LED array on one chip to reduce the distance of pixel points from millimeters to micrometers, or even nanometers. Because of the small size of the LED chip, it can be used as a pixel on a display panel.

In a production process of a Micro LED/Mini LED display panel, Micro LED/Mini LED chips prepared by epitaxial growth on a wafer substrate are transferred to a driver backplate through a transfer substrate to form an LED array. In the transferring process, electrodes of the Mini LED chips need to be bonded to pads on the driver backplate, and pins of each LED chip and the pads on the driver backplate are connected by surface spot welding, which can be individually controlled. However, when the driver backplate provided by existing technologies is bonded, because of the huge number and the micrometer sizes of the LED chips, the distance between the LED chips is also relatively small, contact areas between the pins of the LED chips and the pads become smaller and smaller, and push-pull forces of the LED chips in a vertical direction become lower and lower. Correspondingly, the pins of the LED chips and the pads often have problems of virtual welding and poor contact which could easily cause the LED chip to fall off. The yield of the products is suppressed, which in turn affects the normal display.

Therefore, there is a need to provide a display panel and a display device to improve the bonding success rate of the LED chips, avoid the problems of virtual soldering and poor contact as much as possible, and improve the product yield and the display effect.

SUMMARY

One aspect of the present disclosure provides a display panel. The display panel includes a substrate; light-emitting devices, a plurality of pad groups on a side of the substrate, and first metal elements and second metal elements at a side of the plurality of pad groups close to the substrate. Each pad group includes a first pad and a second pad, and at least one pad group corresponds to one light-emitting device. In one pad group corresponding to one same light-emitting device, along a direction perpendicular to a plane of the substrate, the first pad at least partially overlaps the first metal elements, the second pad at least partially overlaps the second metal elements, an overlapping area of the first pad and the first metal elements is S1, and an overlapping area of the second pad and the second metal elements is S2, where $|S1-S2|/S1 \leq 5\%$. Or in one pad group corresponding to one same light-emitting device, along the direction perpendicular to the plane of the substrate, the first pad does not overlap the first metal elements, and the second pad does not overlap the second metal elements.

One aspect of the present disclosure provides a display device. The display device includes a display panel. The display panel includes a substrate; light-emitting devices, a plurality of pad groups on a side of the substrate, and first metal elements and second metal elements at a side of the plurality of pad groups close to the substrate. Each pad group includes a first pad and a second pad, and at least one pad group corresponds to one light-emitting device. In one pad group o corresponding to one same light-emitting device, along a direction perpendicular to a plane of the substrate, the first pad at least partially overlaps the first metal elements, the second pad at least partially overlaps the second metal elements, an overlapping area of the first pad and the first metal elements is S1, and an overlapping area of the second pad and the second metal elements is S2, where $|S1-S2|/S1 \leq 5\%$. Or in one pad group corresponding to one same light-emitting device, along the direction perpendicular to the plane of the substrate, the first pad does not overlap the first metal elements, and the second pad does not overlap the second metal elements.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
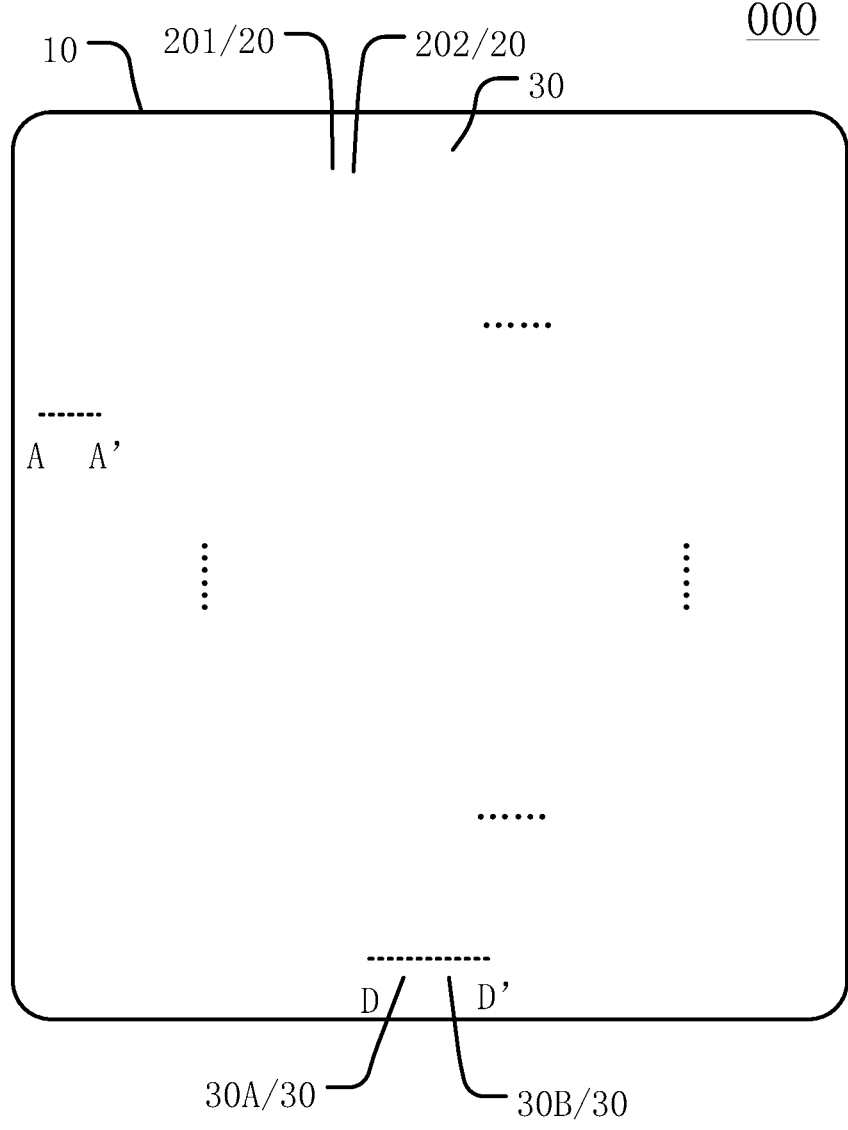
FIG. 1 illustrates a plan view of a structure of an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

Figure 2:
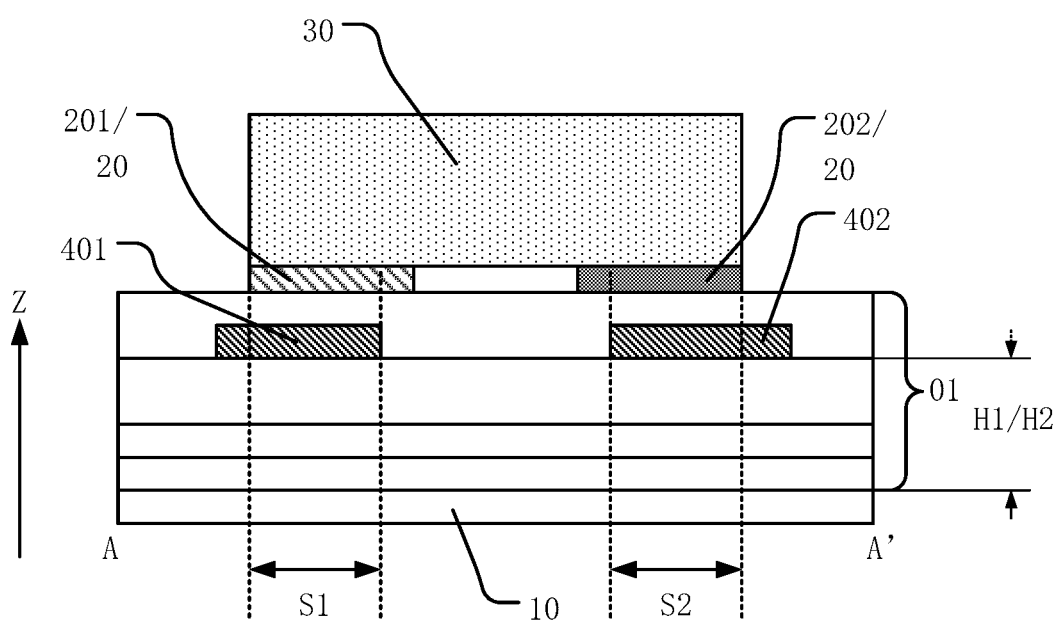
FIG. 2 illustrates a cross-sectional view of the display panel in FIG. 1 along an A-A' direction.
Figure 3:
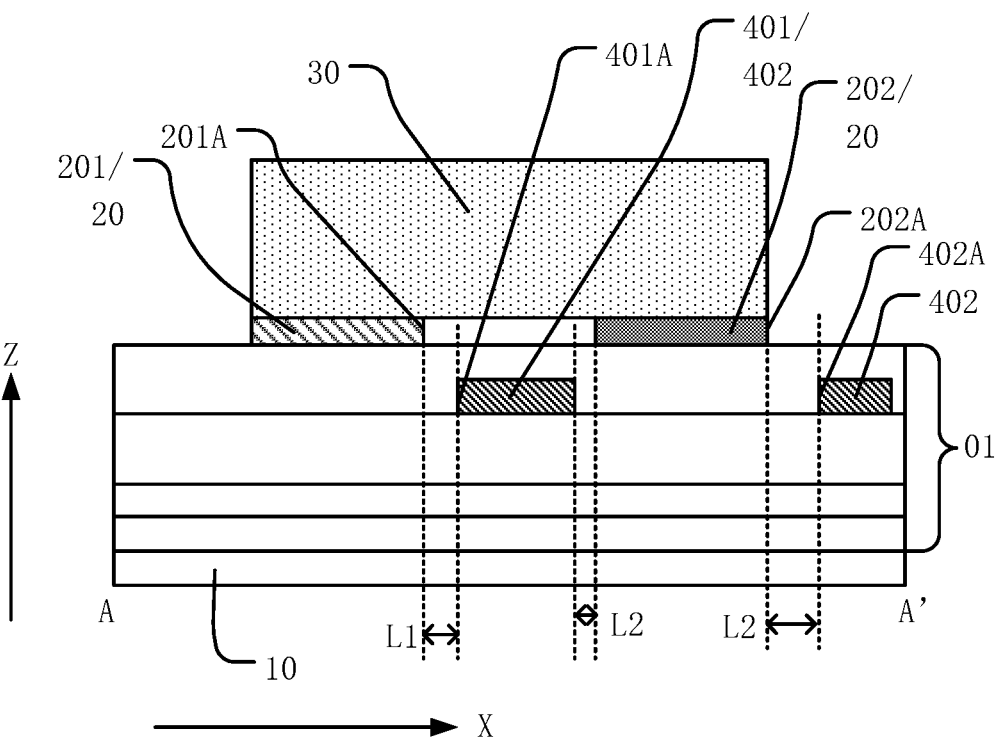
Figure 4:
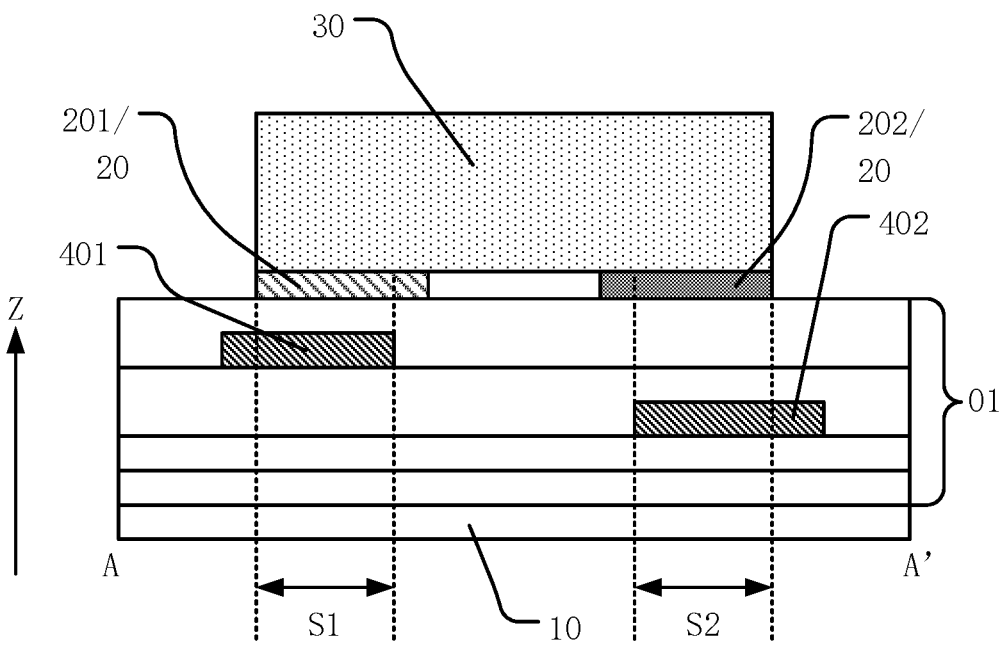
FIG. 4 illustrates another cross-sectional view of the display panel in FIG. 1 along an A-A' direction.
Figure 5:
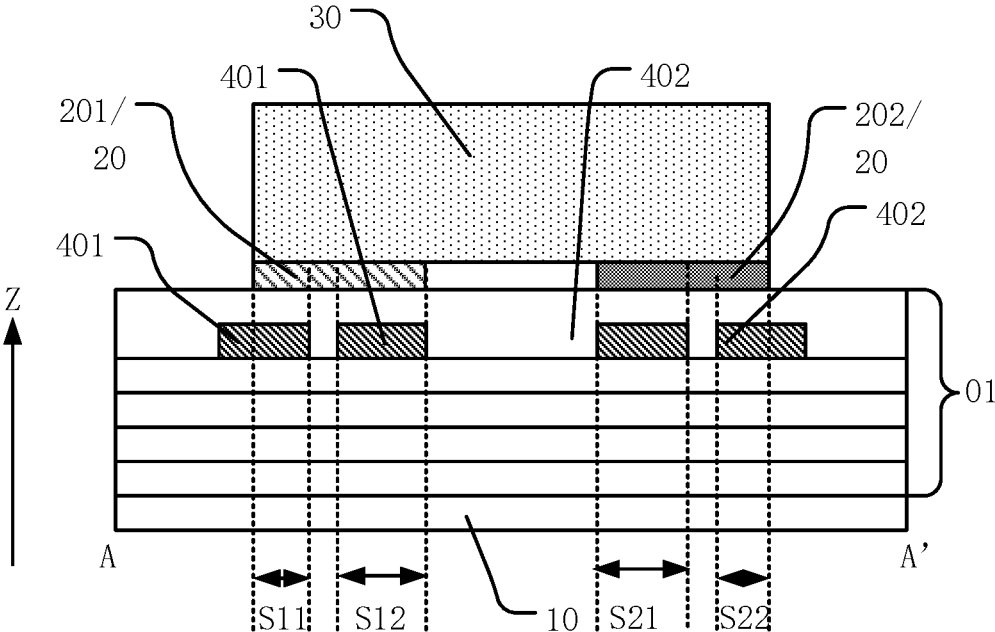
FIG. 5 illustrates another cross-sectional view of the display panel in FIG. 1 along an A-A' direction.

The present disclosure provides a display panel. FIG. 1 illustrates a planar structure of an exemplary display panel consistent with various disclosed embodiments in the present disclosure; FIG. 2 illustrates a cross-sectional view of the display panel in FIG. 1 along an A-A' direction; FIG. 3 illustrates a cross-sectional view of the display panel in FIG. 1 along the A-A' direction; FIG. 4 illustrates another cross-sectional view of the display panel in FIG. 1 along the A-A' direction; FIG. 5 illustrates another cross-sectional view of the display panel in FIG. 1 along the A-A' direction. For clear illustration of the structure, the drawing in FIG. 1 is filled with transparency. As shown in FIG. 1, in one embodiment, the display panel 000 may include a substrate 10, a plurality of pad groups 20, light-emitting devices 30, first metal elements 401 and second metal elements 402.

The plurality of pad groups 20 may be disposed at a side of the substrate 10. Each of the plurality of pad groups 20 may include a first pad 201 and a second pad 202. At least one of the plurality of pad groups 20 may correspond to one light-emitting device 30.

The first metal elements 401 and the second metal elements 402 may be disposed at a side of the plurality of pad groups 20 close to the substrate 10.

In one embodiment shown in FIG. 2, in one of the plurality of pad groups 20 corresponding to one same light-emitting device 30, the first pad 201 and the first metal elements 401 may at least partially overlap, and the second pad 202 and the second metal elements 402 may at least partially overlap, along a direction Z perpendicular to a plane of the substrate 10. An overlapping area of the first pad

201 and the first metal elements 401 is S1, and an overlapping area of the second pad 202 and the second metal elements 402 is S2, where $$\frac{|S1 - S2|}{S1} \leq 5\%.$$

In another embodiment shown in FIG. 3, in one of the plurality of pad groups 20 corresponding one same light-emitting device 30, the first pad 201 and the first metal elements 401 may not overlap, and the second pad 202 and the second metal elements 402 may not partially overlap, along the direction Z perpendicular to a plane of the substrate 10.

In the present disclosure, the display panel 000 may include the substrate 10. The substrate 10 may be used as a carrier substrate of the display panel 000, and other structures of the display panel 000 may be formed on the substrate 10. The plurality of pad groups 20 may be disposed on one side of the substrate 10, and at least one pad group 20 of the plurality of pad groups 20 may be disposed corresponding to one light-emitting device 30. Each of the plurality of pad groups 20 may include the first pad 201 and the second pad 202. Optionally, the light-emitting devices 30 may include mini LED (sub-millimeter light-emitting diode), a micro LED (miniature light-emitting diode), a nano LED (nano light-emitting diode), or a combinations thereof. The micro LED and mini-LED are smaller than traditional LEDs, and the size is about ⅓ the size of traditional LEDs. Nano LEDs refer to LEDs with a single size below 1 micrometer (nanoscale). The micro LED, mini LED, and nano LED display technologies are self-luminous technologies, and have advantages of low power consumption, high brightness, ultra-high resolution and color saturation, fast response speed, ultra-power saving, long life, and high efficiency higher. In one embodiment, pins (such as cathode pins and anode pins) of the light-emitting devices 30 may be respectively bonded to the first pads 201 and the second pads 202 of the plurality of pad groups 20. For example, the anode pin of one light-emitting device 30 may be bonded to the first pad 201 to realize the electrical connection between the anode pin of the light-emitting device 30 and the first pad 201, and the cathode pin of the light-emitting device 30 may be bonded to the second pad 202 to realize the electrical connection between the cathode pin of the light-emitting device 30 and the second pad 202. Anode driving signals may be provided to the anode pin of the light-emitting device 30 through devices (not shown in the figure, such as a driving transistor) in a driving circuit layer connected to the first pad 201, and cathode driving signals may be provided to the cathode pin of the light-emitting device 30 through a cathode signal line connected to the second pad 202, to drive the light-emitting device 30 to emit light. For description purposes only, the embodiment in FIG. 1 where one light-emitting device 30 corresponds to at least one pad group 20 is used as an example for illustration, and does not limit the scope of the present disclosure. In various embodiments, the number of pad groups 20 corresponding to one light-emitting device 30 may have various suitable values. For example, in another embodiment, one light-emitting device 30 may correspond to two pad groups 20, and one of the two pad groups 20 may be used as a spare pad group, such that the spare pad group may be used when another other pad group 20 fails. Therefore, even if there is a possibility of virtual soldering in one pad group 20, the display panel may be repaired by another spare pad group to ensure electrical connection such that the corresponding light-emitting device 30 is able to emit light normally. Optionally, the light-emitting device 30 and its corresponding pad group 20 may be overlapped in the direction perpendicular to the plane where the substrate 10 is located, that is, the light-emitting device 30 may be bonded and arranged above the corresponding pad group 20.

In existing technology, a driver circuit layer 01 may also be disposed between the substrate 10 and the plurality of pad groups 20. The first metal elements 401 and the second metal elements 402 may be part of the structure of the driver circuit layer 01. The driver circuit layer 01 may include a plurality of conductive structures (such as metal conductive structures including transistors) and a plurality of conductive signal lines (such as scan signal lines, data signal lines, power signal lines, etc.), and may also include a plurality of insulating layers that play an insulating role, which are not shown in the figure. By setting the driving circuit layer 01, the driving signals may be transmitted to each light-emitting device 30, and the normal light-emitting display effect of the light-emitting device 30 may be realized. Since the driving circuit layer 01 includes many conductive film layers, the patterned circuit wiring design may likely cause the height difference between the first pad 201 and the second pad 202 in one pad group 20 to be too large. That is, the wiring design of the driving circuit layer 01 may tend to be unevenly distributed, such that the height difference between the first pad 201 and the second pad 202 in one pad group 20 may be too large. Therefore, when the light-emitting device 30 is bonded to the corresponding pad group 20, it may be easy to cause problems such as virtual soldering and poor contact between the pins of the light-emitting device 30 and the first pad 201 and the second pad 202 in the pad group 20, which seriously affects the yield of the product and display quality.

To at least partially alleviate the above problems, in the present disclosure, the first metal elements 401 and the second metal elements 402 may be disposed at the side of the plurality of pad groups 20 close to the substrate 10 in the display panel 000. Optionally, the first metal elements 401 and the second metal elements 402 may be two metal structures disposed in a same film layer of the driving circuit layer, or two metal structures in different layers of a plurality of film layers of the driving circuit layer. The present disclosure has no limit on this, as long as the first metal elements 401 and the second metal elements 402 are disposed at the side of the plurality of pad groups 20 close to the substrate 10. In the present disclosure, in one of the plurality of pad groups 20 corresponding one same light-emitting device 30, the first pad 201 and the first metal elements 401 may at least partially overlap, and the second pad 202 and the second metal elements 402 may at least partially overlap, along the direction Z perpendicular to the plane of the substrate 10. That is, the first metal elements 401 may be disposed at least partially directly under the first pad 201 and the second metal elements 402 may be disposed at least partially directly under the second pad 202. The overlapping area S1 of the first pad 201 and the first metal elements 401 may be the same as the overlapping area S2 of the second pad 202 and the second metal elements 402. In some embodiments, there may be process errors during the manufacturing process and the overlapping areas S1 and S2 may not be exactly equal, but as long as S1 and S2 satisfy $(|S1-S2|)/S1 \leq 5\%$, it may be understood as that the overlapping area S1 of the first pad 201 and the first metal elements 401 and the overlapping area S2 of the second pad 202 and the second metal elements 402 are substantially equal.

Therefore, in one of the plurality of pad groups 20 corresponding one same light-emitting device 30, an area of the metal elements overlapping the first pad 201 may be the same as an area of the metal elements overlapping the second pad 202, that is, the first pad 201 and the second pad 202 may be substantially kept on a same horizontal plane, to avoid the height difference between the first pad 201 and the second pad 202 in the direction Z perpendicular to the plane where the substrate 10 is located as much as possible. Therefore, the flatness of the first pad 201 and the second pad 202 corresponding to one same light-emitting device 30 may be improved. In another embodiment shown in FIG. 3, in one of the plurality of pad groups 20 corresponding one same light-emitting device 30, the first pad 201 and the first metal elements 401 may not overlap, and the second pad 202 and the second metal elements 402 not overlap, along the direction Z perpendicular to the plane of the substrate 10. That is, the first metal elements 401 may not be disposed directly under the first pad 201 and the second metal elements 402 may not be disposed directly under the second pad 202. The metal elements may not be provided under the first pad 201 and the second pad 202 of the pad group 20, to avoid destroying the flatness thereof. Correspondingly, when the light-emitting device 30 is bonded to the corresponding pad group 20, it may be prevented that the metal elements is disposed under one pad in one same pad group 20 to raise the film layer and the metal elements is not disposed under another pad in the same pad group 20. Therefore, the plurality of pad groups 20 may be prevented from having a poor flatness, and the problem of virtual soldering or poor contact between the light-emitting device 30 and the corresponding pad group 20 may be avoided. By avoiding the height difference in the direction Z perpendicular to the plane where the bottom 10 is located, the electrical connection stability when the light-emitting device 30 is bonded to the first pad 201 and the second pad 202 in the corresponding pad group 20 and the bonding yield may be improved, thereby improving product yield and display quality.

For description purposes only, in the embodiment in FIG. 2, in one of the plurality of pad groups 20 corresponding one same light-emitting device 30, the first pad 201 and the first metal elements 401 may at least partially overlap, and the second pad 202 and the second metal elements 402 may at least partially overlap, along the direction Z perpendicular to the plane of the substrate 10. That is, the first metal elements 401 may be disposed at least partially directly under the first pad 201 and the second metal elements 402 may be disposed at least partially directly under the second pad 202. Therefore, the embodiment in FIG. 2 illustrates a structure where the first metal elements 401 and the second metal elements 402 are disposed in a same metal film layer. For description purposes only, the embodiment in FIG. 2 is used as an example to illustrate the present disclosure, and the structure of the first metal elements 401 and the second metal elements 402 includes but is not limited to this.

In one embodiment shown in FIG. 2, in one of the plurality of pad groups 20 corresponding one same light-emitting device 30, the first pad 201 and one first metal element 401 may at least partially overlap, and the second pad 202 and one second metal element 402 may at least partially overlap, along the direction Z perpendicular to the plane of the substrate 10. That is, one first metal element 401 may be disposed at least partially directly under the first pad 201 and one second metal element 402 may be disposed at least partially directly under the second pad 202. The first metal elements 401 and the second metal elements 402 may be disposed in a same film layer.

In another embodiment shown in FIG. 4, in one of the plurality of pad groups 20 corresponding one same light-emitting device 30, the first pad 201 and one first metal element 401 may at least partially overlap, and the second pad 202 and one second metal element 402 may at least partially overlap, along the direction Z perpendicular to the plane of the substrate 10. That is, one first metal element 401 may be disposed at least partially directly under the first pad 201 and one second metal element 402 may be disposed at least partially directly under the second pad 202. The first metal element 401 at least partially overlapping the first pad 201 and the second metal element 402 at least partially overlapping the second pad 202 may be disposed in different film layers.

In another embodiment shown in FIG. 5, in one of the plurality of pad groups 20 corresponding one same light-emitting device 30, the first pad 201 and two or more first metal elements 401 may at least partially overlap, and the second pad 202 and two or more second metal elements 402 may at least partially overlap, along the direction Z perpendicular to the plane of the substrate 10. For example, two first metal elements 401 may be disposed at least partially under the first pad 201 and two second metal elements 402 may be disposed at least partially under the second pad 202. The two first metal elements 401 and the two second metal elements 402 may be disposed in a same film layer. The overlapping area S1 of the first pad 201 and the first metal elements 401 may be understood as the sum of the overlapping areas of the first pad 201 and the two first metal elements 401, and the overlapping area S2 of the second pad 202 and the second metal elements 402 may be understood as the sum of the overlapping areas of the second pad 202 and the two second metal elements 402. That is, the sum S1 of the overlapping areas of the first pad 201 and the two first metal elements 401 (S11+S12=S1 in FIG. 5) and the sum S2 of the overlapping areas of the second pad 202 and the two second metal elements 402 (S21+S22=S2 in FIG. 5) may be substantially equal or equal.

Figures 6, 7:
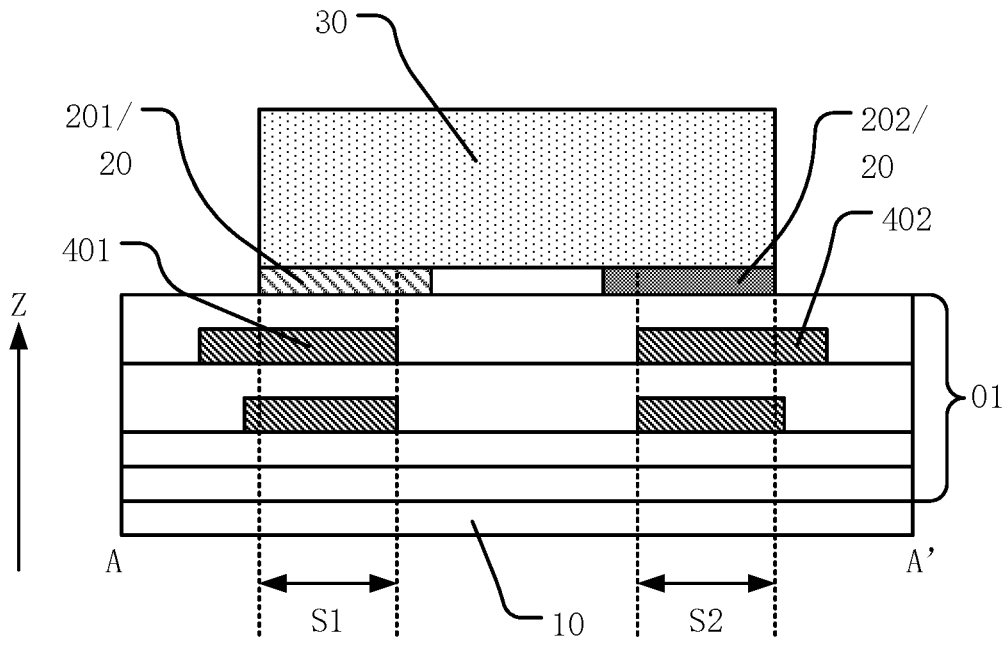
FIG. 6 illustrates another cross-sectional view of the display panel in FIG. 1 along an A-A' direction.
FIG. 7 illustrates another cross-sectional view of the display panel in FIG. 1 along an A-A' direction.

In another embodiment shown in FIG. 6 which is another cross-sectional view of the display device in FIG. 1 along the A-A' direction, in one of the plurality of pad groups 20 corresponding one same light-emitting device 30, the first pad 201 and two first metal elements 401 may at least partially overlap, and the second pad 202 and two second metal elements 402 may at least partially overlap, along the direction Z perpendicular to the plane of the substrate 10. For example, one of the two first metal elements 401 may be disposed under the first pad 201 and one of the two second metal elements 402 may be disposed under the second pad 202. The two first metal elements 401 and the two second metal elements 402 may be disposed in different film layers. The overlapping area S1 of the first pad 201 and the first metal elements 401 may be understood as the overlapping areas of the first pad 201 and one of the two first metal elements 401, and the overlapping area S2 of the second pad 202 and the second metal elements 402 may be understood as the overlapping areas of the second pad 202 and one of the two second metal elements 402. S1 and S2 may be substantially equal or equal.

In other embodiments, the first metal elements 401 and the second metal elements 402 may have other configuration structure, as long as the first metal elements 401 may be disposed at least partially under the first pad 201 and the second metal elements 402 may be disposed at least partially under the second pad 202, the overlapping area S1 of the first pad 201 and the first metal elements 401 and the overlapping area S2 of the second pad 202 and the second metal elements 402 may be substantially equal or exactly same satisfying the error relationship ($|S1-S2|$)/$S1 \leq 5\%$.

The shape and size of the first pad 201 and the second pad 202 are not specifically limited in the present disclosure. In various embodiments, the first pad 201 and the second pad 202 may both be square or bar, or the shape and size of the first pad 201 and the second pad 202 may be the same. The present disclosure does not specifically limit the shape and size of the first metal elements 401 that at least partially overlap the first pad 201, and does not specifically limit the shape and size of the second metal elements 402 that at least partially overlap the second pad 202. The first metal elements 401 and the second metal elements 402 may be block-shaped conductive structures, or may be strip-shaped or linear wire structures, which are not specifically limited in the present disclosure, as long as the first metal elements 401 may be disposed at least partially under the first pad 201 and the second metal elements 402 may be disposed at least partially under the second pad 202, the overlapping area S1 of the first pad 201 and the first metal elements 401 and the overlapping area S2 of the second pad 202 and the second metal elements 402 may be substantially equal or exactly same.

For description purposes only, the embodiments with schematic structures of the display panel shown in the drawings are used as examples to illustrate the present disclosure. In various embodiments, the display panel 000 may have but are not limited to the illustrated structures. The display panel 000 may have any suitable structures capable of realizing display, and may be made reference to the structures of display panels with micro LED, mini LED, or nano LED.

For description purposes only, the embodiment shown in FIG. 1 where the light-emitting devices 30 are arranged on the substrate 10 as an array is used as an example to illustrate the present disclosure, and does not limit the scope of the present disclosure. In various embodiments, the plurality of light-emitting devices 30 may be arranged in other manners and the present disclosure has no limit on this.

In another embodiment shown in FIG. 1 and FIG. 7 which is another cross-sectional view of the display device in FIG. 1 along the A-A' direction, a packaging form of one light-emitting device 30 may be a horizontal light-emitting chip, a first pin 301 of the horizontal light-emitting chip (such as a P electrode, an anode pin in a PN junction) and a second pin 302 (such as a N electrode, a cathode pin in the PN junction) may be located on a side surface of the light-emitting device 30 facing the substrate 10. When bonding the light-emitting device 30 to the corresponding pad group 20, it may be necessary to ensure that the first pad 201 and the second pad 202 in one of the plurality pad groups 20 corresponding to the same light-emitting device 30 have high flatness, to guarantee the bonding effect between the first pin 301 of the light-emitting device 30 and the first pad 201 and between the second pin 302 of the light-emitting device 30 and the second pad 202.

Figure 8:
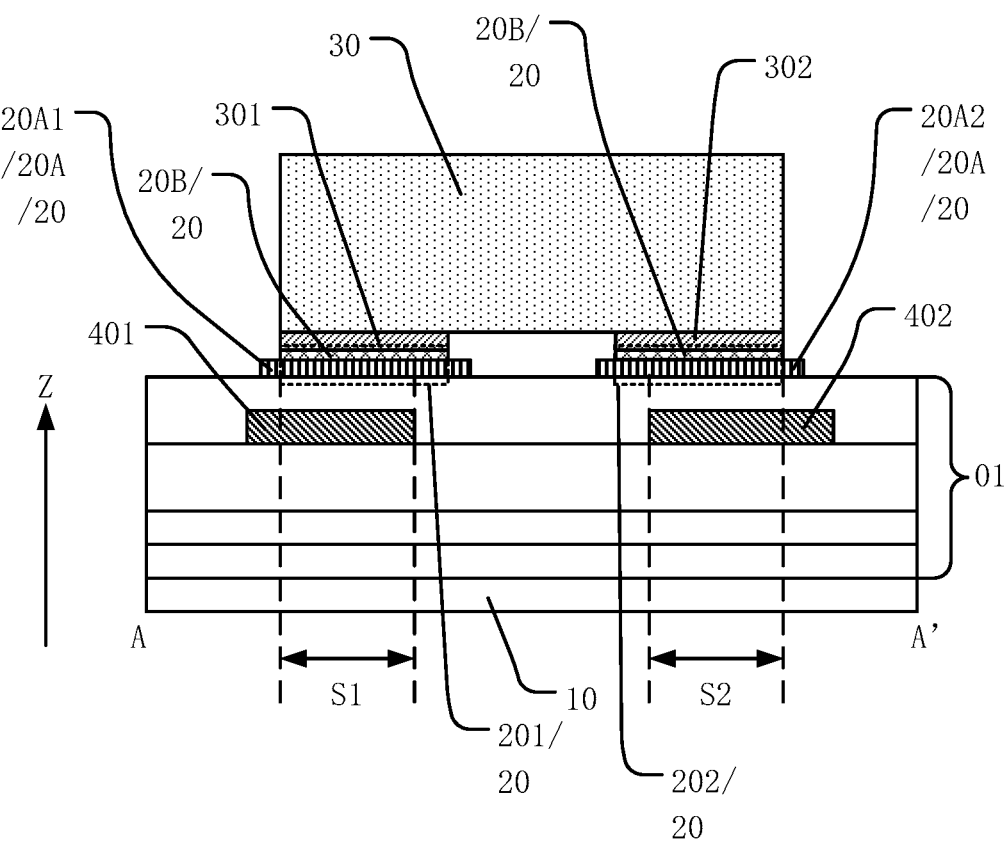
FIG. 8 illustrates another cross-sectional view of the display panel in FIG. 1 along an A-A' direction.

In another embodiment shown in FIG. 1 and FIG. 8 which is another cross-sectional view of the display device in FIG. 1 along the A-A' direction, one pad group 20 of the plurality of pad groups 20 may include an electrode layer 20A and a eutectic layer 20B located on a side of the electrode layer 20A away from the substrate 10. The electrode layer 20A may include a first electrode 20A1 and a second electrode 20A2 made of metal conductive materials. The eutectic layer 20B may be made of a high melting point eutectic material, such as a eutectic material of solder and silver or gold. An overlapping area of the eutectic layer 20B and the first electrode 20A1 of the electrode layer 20A may be understood as an area of the first pad 201 in this embodiment. An overlapping area of the eutectic layer 20B and the second electrode 20A2 of the electrode layer 20A may be understood as an area of the second pad 202 in this embodiment (the area indicated by the dotted line in FIG. 8). The eutectic layer 20B may have the characteristics of good conduction and high heat dissipation performance. The first pin 301 of the light-emitting device 30 may be electrically connected to the first electrode 20A1 through the eutectic layer 20B. The side surface of the eutectic layer 20B away from the substrate 10 may be fixedly bonded with and electrically connected to the first pin 301 of the light-emitting device 30, and another side surface of the eutectic layer 20B facing the substrate 10 may be fixedly bonded with the first electrode 20A1. The second pin 302 of the light-emitting device 30 may be fixedly bonded with and electrically connected to the second electrode 20A2 by the eutectic layer 20B. The side surface of the eutectic layer 20B away from the substrate 10 may be fixedly bonded with and electrically connected to the second pin 302 of the light-emitting device 30, and the side surface of the eutectic layer 20B facing the substrate 10 may be fixedly bonded with the second pin 302 of the light-emitting device 30. The transmission of the driving signal may be achieved therefore.

In one embodiment shown in FIG. 1, FIG. 2, FIG. 5, and FIG. 9 which is another cross-sectional view of the display device in FIG. 1 along the A-A' direction, the first metal elements 401 and the second metal elements 402 may be disposed in a same layer.

Figure 9:
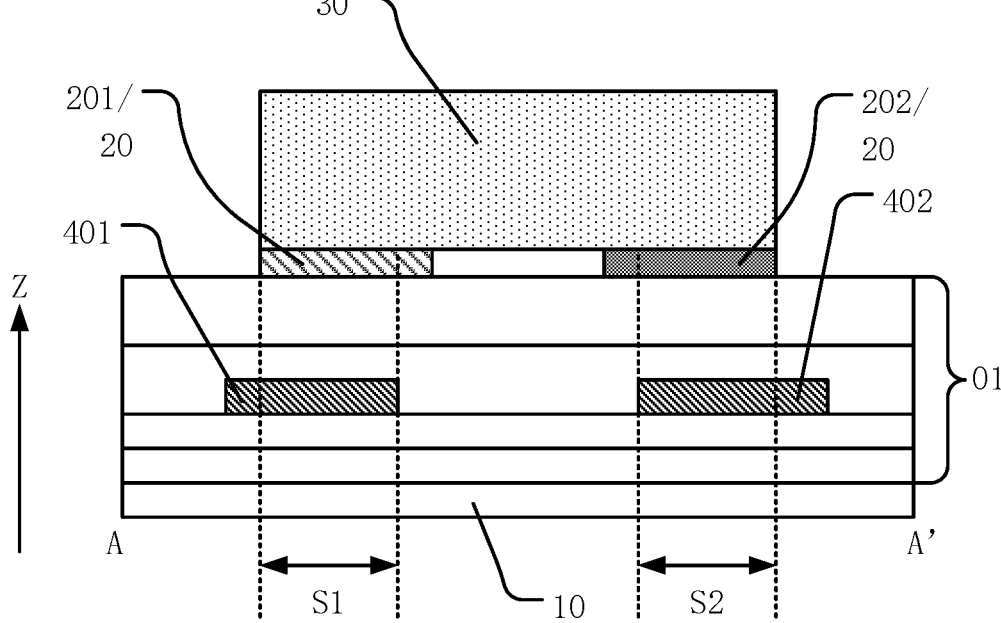
FIG. 9 illustrates another cross-sectional view of the display panel in FIG. 1 along an A-A' direction.

In the present embodiment, the first metal elements 401 and the second metal elements 402 may be disposed in a same layer. As shown in FIG. 2, FIG. 5, and FIG. 9, the first metal elements 401 and the second metal elements 402 may be metal structures in any film layer of the driving circuit layer 01 between the plurality of pad groups 20 and the substrate 10, as long as the first pad 201 overlaps the first metal elements 401 directly under the first pad 201 and the second pad 202 overlaps the second metal elements 402 directly under the second pad 202 when the first metal elements 401 and the second metal elements 402 are disposed in the same layer. No matter which film layer the first metal elements 401 and the second metal elements 402 are located in the driving circuit layer 01, the overlapping area S1 of the first pad 201 and the first metal elements 401 and the overlapping area S2 of the second pad 202 and the second metal elements 402 may be substantially equal or exactly equal, such that the first pad 201 and the second pad 202 may be substantially kept on a same horizontal plane to avoid the height difference between the first pad 201 and the second pad 202 in the direction Z perpendicular to the plane where the substrate 10 is located as much as possible. Therefore, the flatness of the first pad 201 and the second pad 202 corresponding to one same light-emitting device 30 may be improved. Correspondingly, the electrical connection stability when the light-emitting device 30 is bonded to the first pad 201 and the second pad 202 in the corresponding pad group 20 and the bonding yield may be improved, thereby improving product yield and display quality.

Figure 10:
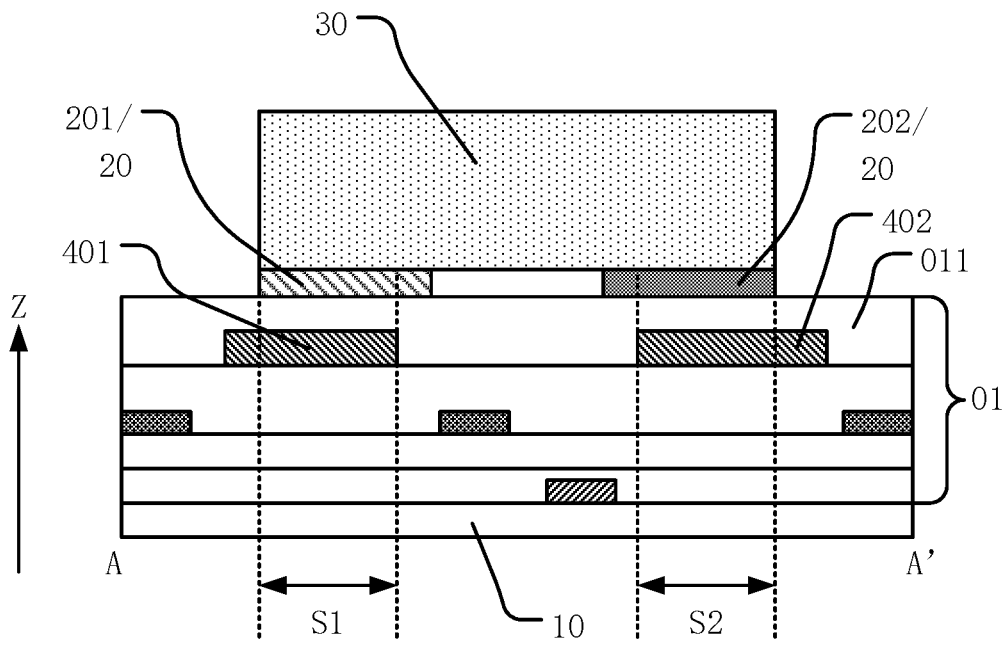
FIG. 10 illustrates another cross-sectional view of the display panel in FIG. 1 along an A-A' direction.

In one embodiment shown in FIG. 1 and FIG. 10 which is another cross-sectional view of the display device in FIG. 1 along the A-A' direction, the display panel 000 may include a first metal layer at the side of the plurality of pad groups 20 close to the substrate 10. In one pad group 20 of the plurality of pad groups 20, the first metal elements 401 and the second metal elements 402 may be disposed in the first metal layer 40, and there may be no other metal layers between the first metal layer 40 and the plurality of pad groups 20.

In the present embodiment, the first metal elements 401 and the second metal elements 402 may be disposed in a same layer, for example, in the first metal layer 40 of the driving circuit layer 01. Therefore, the first metal layer 40 may be one of the plurality of metal film layers in the driving circuit layer 01 closest to the plurality of pad groups 20, that is, there may be no other metal layers between the first metal layer 40 and the plurality of pad groups 20. When the first metal layer 40 is multiplexed as a certain metal layer in the driving circuit layer 01, it may be preferable to multiplex the metal layer closest to the plurality of pad groups 20. That is, during the manufacturing process of the display panel 000, there may be no other metal layer manufacturing process after forming the first metal layer and before forming the plurality of pad groups 20. There may be no other metal structures on the first metal layer 40 to affect the flatness of the film layers under the first pad 201 and the second pad 202 in one of the plurality of pad groups 20. After the insulating layer 011 for insulating the first metal layer 40 from the plurality of pad groups 20 is fabricated on the first metal layer 40, a relatively flat film substrate may be provided for the fabrication of the plurality of pad groups 20, such that the first pad 201 and the second pad 202 have good flatness and is able to be basically on the same level. The bonding yield of the light-emitting device 30 may be improved, which is beneficial to better improve the display effect.

In one embodiment shown in FIG. 10, other metal layers may be disposed between the first metal layer 40 and the substrate 10. The other metal layers may be a portion of metal conductive film layers of the driving circuit layer 01, and may be used to form structures including transistor structures, scanning line structures or other conductive structures. The present disclosure has no limit on the arrangement of the metal structures in the other metal film layers, as long as the first pad 201 in the pad group 20 corresponding to the same light-emitting device 30 at least partially overlaps the first metal elements 401 of the first metal layer 40 and the second pad 202 at least partially overlaps the second metal elements 402 of the first metal layer 40 in the direction Z perpendicular to the plane where the substrate 10 is located. That is, the first metal elements 401 may be disposed at least partially directly under the first pad 201 and the second metal elements 402 may be disposed at least partially directly under the second pad 202. The overlapping area S1 of the first pad 201 and the first metal elements 401 and the overlapping area S2 of the second pad 202 and the second metal elements 402 may be substantially same or exactly same. In some other embodiments, in one of the plurality of pad groups 20 corresponding one same light-emitting device 30, the first pad 201 and the first metal elements 401 may not overlap, and the second pad 202 and the second metal elements 402 not overlap, along the direction Z perpendicular to the plane of the substrate 10. That is, the first metal elements 401 may not be disposed directly under the first pad 201 and the second metal elements 402 may not be disposed directly under the second pad 202. The first pad 201 and the second pad 202 may be basically kept on the same horizontal plane, and the height difference between the first pad 201 and the second pad 202 in the direction Z perpendicular to the plane of the substrate 10 may be avoided as much as possible, to improve the flatness of the first pad 201 and the second pad 202 corresponding to the same light-emitting device.

Figure 11:
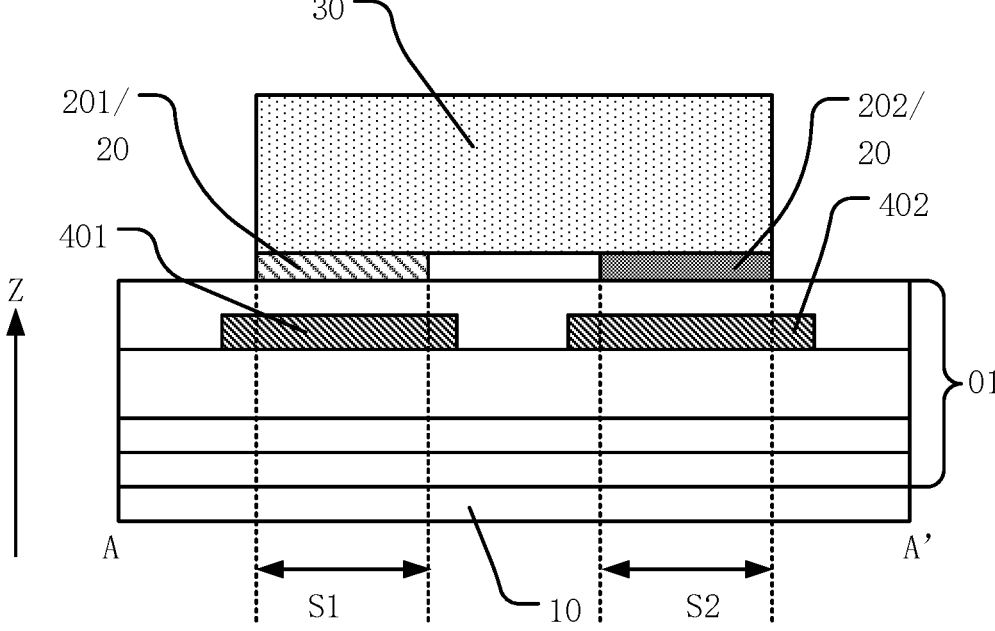
FIG. 11 illustrates another cross-sectional view of the display panel in FIG. 1 along an A-A' direction.

In one embodiment shown in FIG. 1 and FIG. 11 which is another cross-sectional view of the display device in FIG. 1 along the A-A' direction, in one of the plurality of pad groups 20 corresponding one same light-emitting device 30, the first pad 201 and the first metal elements 401 may at least partially overlap, and the second pad 202 and the second metal elements 402 may at least partially overlap, along the direction Z perpendicular to the plane of the substrate 10.

In one of the plurality of pad groups 20 corresponding one same light-emitting device 30, an orthographical projection of the first metal elements 401 overlapping the first pad 201 to the substrate 10 may cover an orthographical projection of the first pad 201 to the substrate 10, and an orthographical projection of the second metal elements 402 overlapping the second pad 202 to the substrate 10 may cover an orthographical projection of the second pad 202 to the substrate 10.

In the present embodiment, in one of the plurality of pad groups 20 corresponding one same light-emitting device 30, the first pad 201 and the first metal elements 401 may at least partially overlap, and the second pad 202 and the second metal elements 402 may at least partially overlap, along the direction Z perpendicular to the plane of the substrate 10. That is, the first metal elements 401 may be disposed in the first metal layer 40 closest to and under the first pad 201 and the second metal elements 402 may be disposed in the first metal layer 40 closest to and under the second pad 202. Further, the orthographical projection of the first metal elements 401 overlapping the first pad 201 to the substrate 10 may cover the orthographical projection of the first pad 201 to the substrate 10, and the orthographical projection of the second metal elements 402 overlapping the second pad 202 to the substrate 10 may cover the orthographical projection of the second pad 202 to the substrate 10. That is, when there are metal structures directly under the first pad 201 and the second pad 202 of the same pad group 20, the areas of the metal structures directly under the pad may be made as large as possible, such that the first metal elements 401 may cover the entire the first pad 201 and the second metal elements 402 may cover the entire second pad 202. Therefore, the metal cushion layer structure under the first pad 201 may be able to support the entire area where the first pad 201 is located, and the metal cushion layer structure under the second pad 202 may be able to support the entire area where the second pad 202 is located. Therefore, the first pad 201 may be prevented from shifting out of the area where the first metal elements 401 is located, to avoid the flatness problem induced by step difference of the first pad 201. Also, the second pad 202 may be prevented from shifting out of the area where the second metal elements 402 is located, to avoid the flatness problem induced by step difference of the second pad 202. Correspondingly, the overlapping area S1 of the first pad 201 and the first metal elements 401 may be the area of the first pad 201 itself, and the overlapping area S2 of the second pad 202 and the second metal elements 402 may be the area of the second pad 202 itself. S1 and S2 may be basically equal or exactly equal, such that the first pad 201 and the second pad 202 are both elevated by the metal structure at the same time. Therefore, the entire first pad 201 and the entire second pad 202 as a whole may be better located on the same horizontal plane, to avoid the height difference between the first pad 201 and the second pad 202 in the direction Z perpendicular to the plane of the substrate 10 as much as possible. Correspondingly, the flatness of the pad group 20 corresponding to the light-emitting device 30 may be further improved, to improve the yield of bonding the light-emitting device 30.

Figure 12:
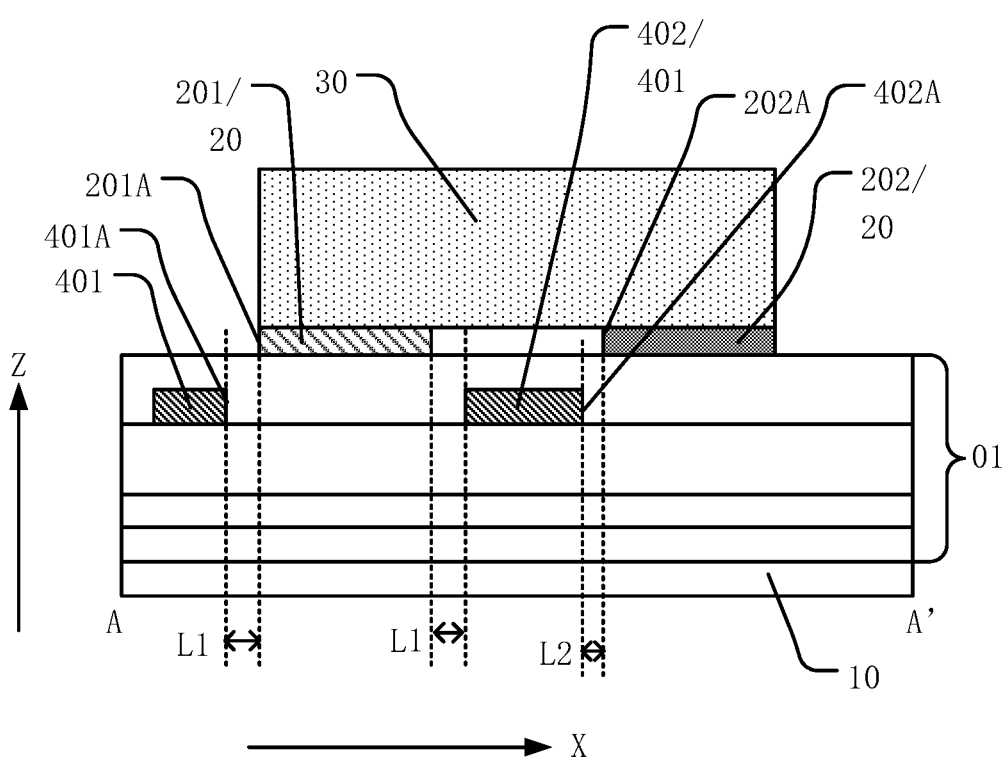
FIG. 12 illustrates another cross-sectional view of the display panel in FIG. 1 along an A-A' direction.
Figure 13:
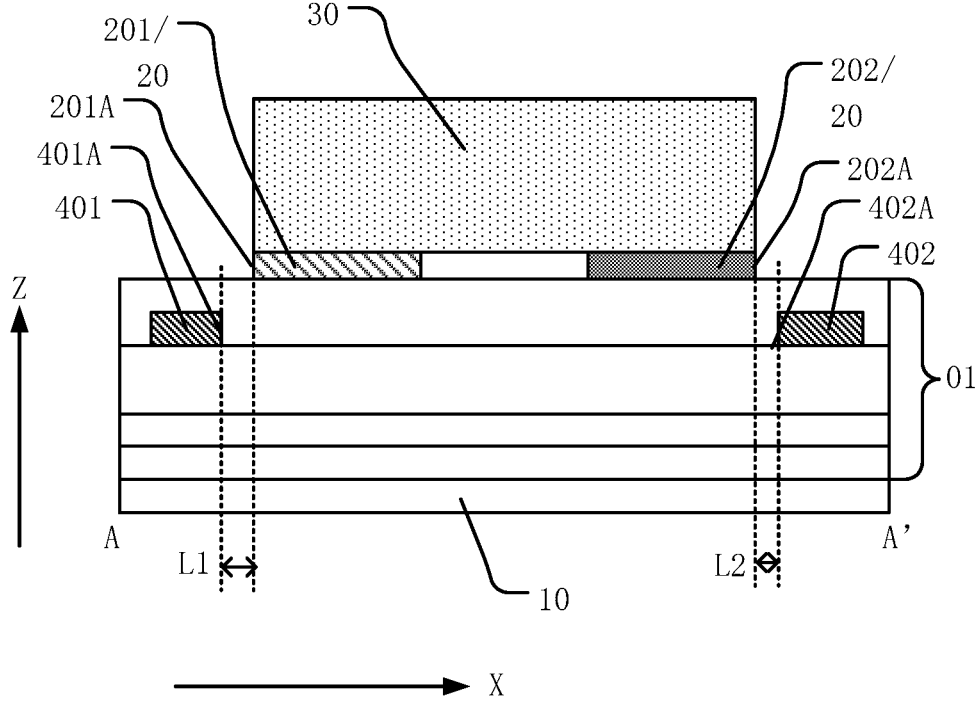
FIG. 13 illustrates another cross-sectional view of the display panel in FIG. 1 along an A-A' direction.
Figure 14:
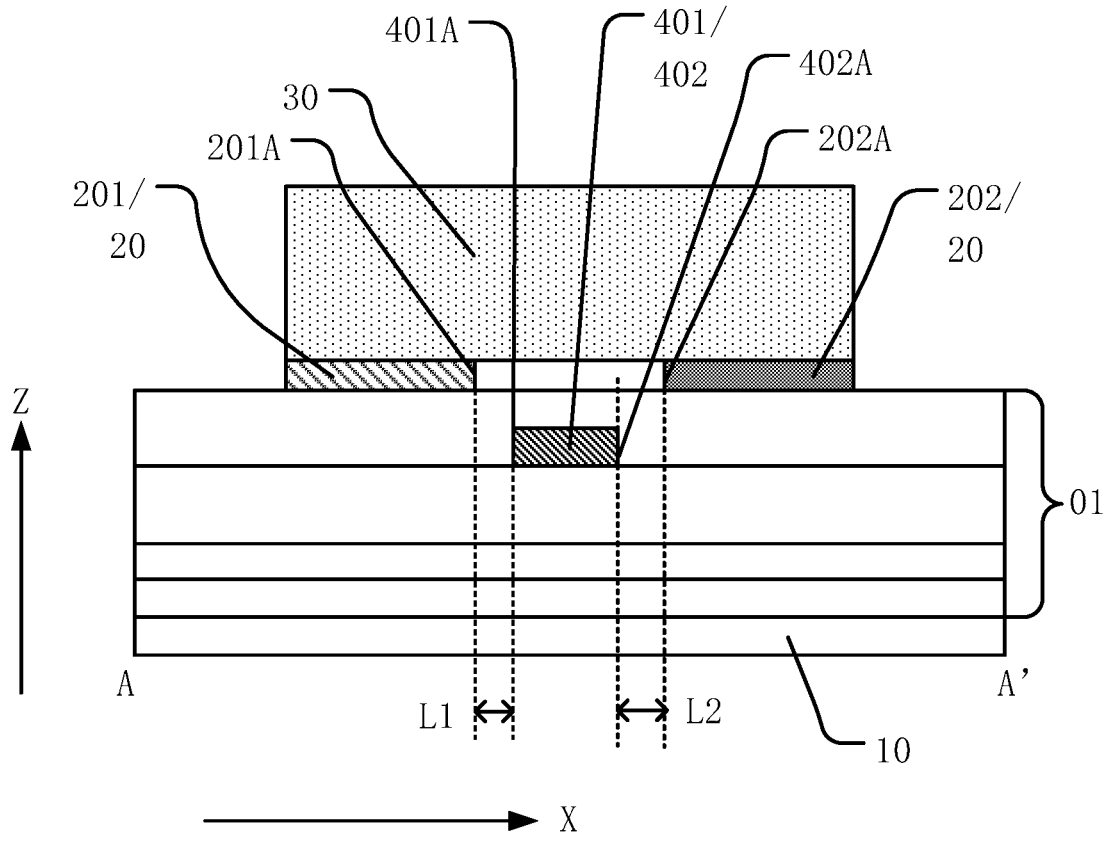
FIG. 14 illustrates another cross-sectional view of the display panel in FIG. 1 along an A-A' direction.

In some embodiments shown in FIG. 1, FIG. 3, FIG. 12 which is another cross-sectional view of the display device in FIG. 1 along the A-A' direction, FIG. 13 which is another cross-sectional view of the display device in FIG. 1 along the A-A' direction, and FIG. 14 which is another cross-sectional view of the display device in FIG. 1 along the A-A' direction, in one of the plurality of pad groups 20 corresponding one same light-emitting device 30, the first pad 201 and the first metal elements 401 may not overlap, and the second pad 202 and the second metal elements 402 may not overlap, along the direction Z perpendicular to the plane of the substrate 10.

In one of the plurality of pad groups 20 corresponding one same light-emitting device 30, in a direction X parallel to the plane of the substrate 10, a minimum distance L1 between the first metal elements 401 and the first pad 201 may be larger than 8.5 μm, and a minimum distance L2 between the second metal elements 402 and the second pad 202 may be larger than 8.5 μm.

In the present embodiment, in one of the plurality of pad groups 20 corresponding one same light-emitting device 30, in the direction Z perpendicular to the plane of the substrate 10, there may be no metal elements overlapping the first pad 201 and the second pad 202, that is, the first pad 201 and the first metal elements 401 may not overlap, and the second pad 202 and the second metal elements 402 may not overlap. As shown in FIG. 3, in one of the plurality of pad groups 20 corresponding one same light-emitting device 30, in the direction X parallel to the plane of the substrate 10, the first metal elements 401 may be disposed between the first pad 201 and the second pad 202, and the second metal elements 402 may be disposed at a side of the second pad 202 away from the first pad 201. In this embodiment, the first metal elements 401 located between the first pad 201 and the second pad 202 may also be understood as a second metal element, and the minimum distance L2 from it to the second pad 202 may also need to be larger than 8.5 μm. In another embodiment shown in FIG. 12, the second metal elements 402 may be located between the first pad 201 and the second pad 202, and the first metal elements 401 may be located at a side of the first pad 201 away from the second pad 202. In this embodiment, the second metal elements 402 located between the first pad 201 and the second pad 202 may also be understood as a first metal element, and the minimum distance L1 from it to the first pad 201 may also need to be larger than 8.5 μm. In another embodiment shown in FIG. 13, the first metal elements 401 may be located at the side of the first pad 201 away from the second pad 202, and the second metal elements 402 may be located at the side of the second pad 202 away from the first pad 201. In another embodiment shown in FIG. 14, the second metal elements 402 and the first metal elements 401 may belong to a same structure, that is, the first metal elements 401 may be multiplexed as the second metal elements 402 and may be disposed between the first pad 201 and the second pad 202. In some other embodiments, the first metal elements 401 and the second metal elements 402 may also be arranged in other ways, as long as there is no metal structure directly below the first pad 201 and the second pad 202 the pad group 20 corresponding to the same light-emitting device to overlap them in the direction Z perpendicular to the plane of the substrate 10.

As shown in FIG. 3, and FIGS. 12-14, in one of the plurality of pad groups 20 corresponding one same light-emitting device 30, in the direction Z perpendicular to the plane of the substrate 10, there may be no metal elements under the first pad 201 and the second pad 202 and overlapping the first pad 201 and the second pad 202. In the direction X parallel to the plane of the substrate 10, the minimum distance L1 between the first metal elements 401 and the first pad 201 may be larger than 8.5 μm, that is, a distance L1 between an edge 401A of the first metal elements 401 facing the first pad 201 and an edge 201A of the first pad 201 facing the first metal elements 401 may be larger than 8.5 μm. Further, the minimum distance L2 between the second metal elements 402 and the second pad 202 may be larger than 8.5 μm, that is, a distance L2 between an edge 402A of the second metal elements 402 facing the second pad 202 and an edge 202A of the second pad 202 facing the second metal elements 402 may be larger than 8.5 μm. Therefore, the difference in flatness caused by the stacking difference of the metal structures directly under the pads may be offset. When the minimum distance L1 from the first metal elements 401 to the first pad 201 is too small, the first metal elements 401 may raise the insulating film layer covering first metal elements 40 and the elevated position may be too close to the first pad 201 which will be subsequently fabricated, causing the first pad 201 fabricated on the insulating layer to be uneven. When the minimum distance L2 from the second metal elements 402 to the second pad 202 is too small, the second metal elements 402 may raise the insulating film layer covering second metal elements 40 and the elevated position may be too close to the second pad 202 which will be subsequently fabricated, causing the second pad 202 fabricated on the insulating layer to be uneven. These problems may be prevented in the present disclosure. In the present embodiment, in one pad group 20 of the plurality of pad groups 20 corresponding to the same light-emitting device 30, in the direction X parallel to the plane of the substrate 10, the minimum distance L1 from the first metal elements 401 to the first pad 201 may be larger, and the minimum distance L2 from the second metal elements 402 to the second pad 202 may be also relatively large. For example, both L1 and L2 may be larger than 8.5 μm. Therefore, in the pad group 20 corresponding to the same light-emitting device 30, when there is no metal structure directly under the first pad 201 and second pad 202 and overlapping the first pad 201 and second pad 202, the height difference between the first pad 201 and the second pad 202 in the direction Z perpendicular to the plane of the substrate 10 may be avoided as much as possible, further improving the flatness of the first pad 201 and the second pad 202 and the product yield.

Figures 15, 16:
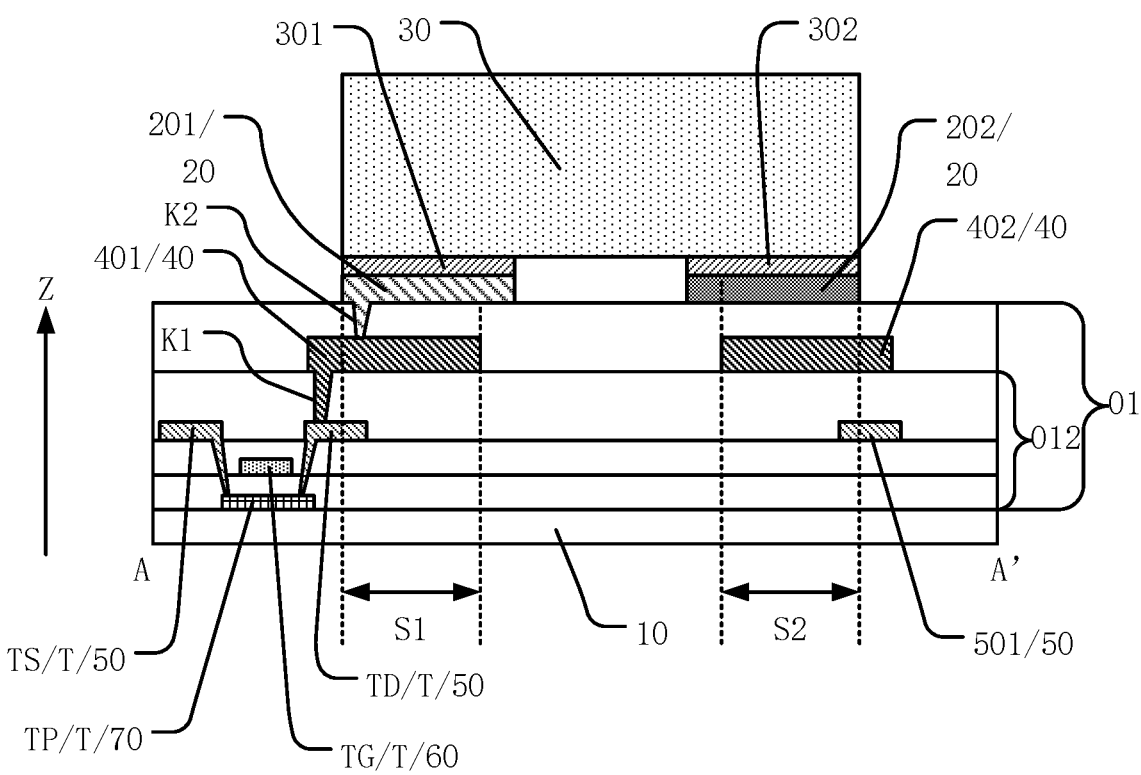
FIG. 15 illustrates another cross-sectional view of the display panel in FIG. 1 along an A-A' direction.
FIG. 16 illustrates another cross-sectional view of the display panel in FIG. 1 along an A-A' direction.
Figures 17, 18:
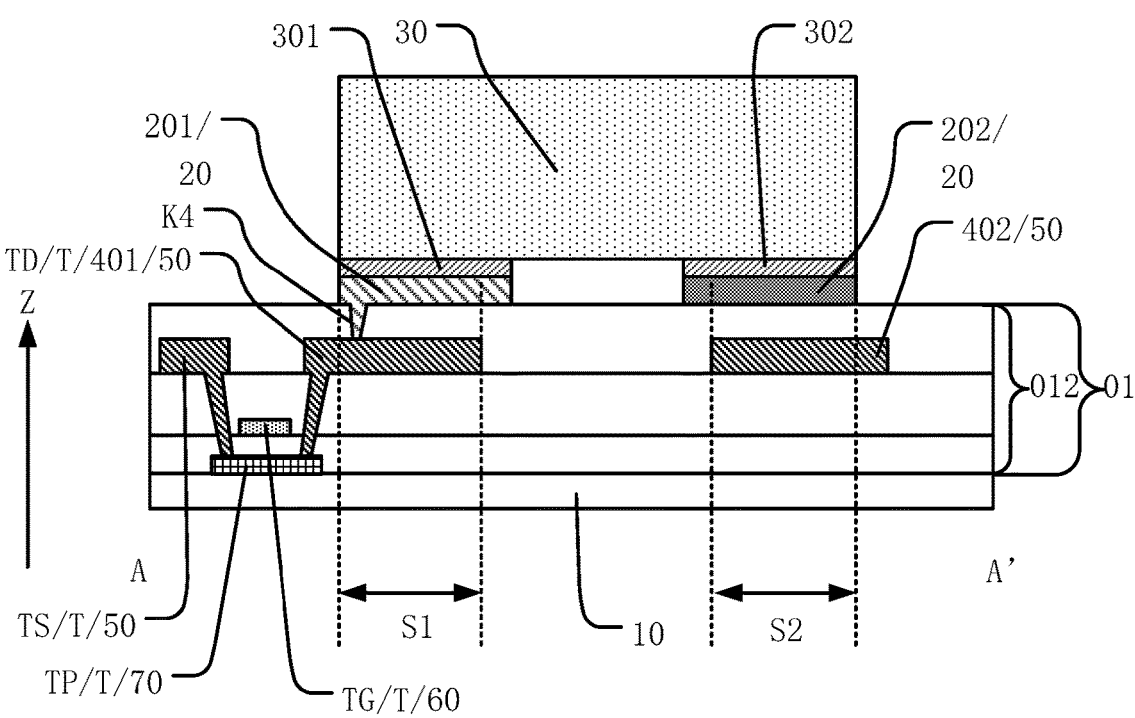
FIG. 17 illustrates another cross-sectional view of the display panel in FIG. 1 along an A-A' direction.
FIG. 18 illustrates another cross-sectional view of the display panel in FIG. 1 along an A-A' direction.

In some embodiments shown in FIG. 1, FIG. 15 which is another cross-sectional view of the display device in FIG. 1 along the A-A' direction, FIG. 16 which is another cross-sectional view of the display device in FIG. 1 along the A-A' direction, and FIG. 17 which is another cross-sectional view of the display device in FIG. 1 along the A-A' direction, the display panel 000 may further include a thin film transistor array layer 012, and the driving circuit layer 01 may be disposed between the substrate 10 and the plurality of pad groups 20. The thin film transistor array layer 012 may be a part of the film layers in the driving circuit layer 01, and the thin film transistor array layer 012 may be located on a side of the plurality of pad groups 20 close to the substrate 10. The thin film transistor array layer 012 may include a plurality of thin film transistors T.

The thin film transistor array layer 012 may include a second metal layer 50. Sources TS and/or drains TD of the plurality of thin film transistors T may be located on the second metal layer 50. The second metal layer 50 may be located on a side of the first metal elements 401 and/or the second metal elements 402 close to the substrate 10. In another embodiment, the first metal elements 401 and/or the second metal elements 402 may be located on the second metal layer 50. Optionally, the source TS or drain TD of one of the plurality of thin film transistors T in this embodiment may be electrically connected to the corresponding first pad 201 (in the figure, the embodiment where the drain TD of the thin film transistor T is electrically connected to the first pad 201 is used as an example for illustration). The light-emitting device 30 may be located on the side of the plurality of pad groups 20 away from the substrate 10. The light-emitting device 30 may include a first lead 301 and a second lead 302. The first lead 301 may be an anode lead, and the second lead 302 may be a cathode pin. The first pin 301 may be bonded and electrically connected to the first pad 201, and the second pin 302 may be bonded and electrically connected to the second pad 202.

In the present embodiment, the display panel 000 may further include the thin film transistor array layer 012, and the driving circuit layer 01 may be disposed between the substrate 10 and the plurality of pad groups 20. The thin film transistor array layer 012 may be a part of the film layers in the driving circuit layer 01, and the thin film transistor array layer 012 may be located on the side of the plurality of pad groups 20 close to the substrate 10. The thin film transistor array layer 012 may include the plurality of thin film transistors T. The thin film transistor array layer 012 may at least include the second metal layer 50, and the second metal layer 50 may be used to form the sources TS and/or the drains TD of the plurality of thin film transistors T. Optionally, the thin film transistor array layer 012 may further include a third metal layer 60 and an active layer 70. The third metal layer 60 may be located on the side of the second metal layer 50 facing the substrate 10, and the active layer 70 may be located on the side of the third metal layer 60 facing the substrate 10. The third metal layer 60 may be used to form the gates TG of the plurality of thin film transistors T, and the active layer 70 may be used to form the active parts TP of the plurality of thin film transistors T. As shown in FIG. 15, in one embodiment, the second metal layer 50 may be located on the side of the first metal elements 401 and/or the second metal elements 402 facing the substrate 10, that is, when the first metal elements 401 and the second metal elements 402 are disposed in a same layer such as the first metal layer 40, the first metal layer 40 may be located on the side of the second metal layer 50 away from the substrate 10, and the first metal layer where the first metal elements 401 and the second metal elements 402 are located may be a metal film layer closest to the plurality of pad groups 20. In this embodiment, for one thin-film transistor T of the plurality of thin film transistors T to provide the driving signal to the corresponding light-emitting device 30, the drain TD of the thin-film transistor T may need to be electrically connected to the first pin (anode pin) of the light-emitting device 30. The drain TD of the thin-film transistor T may be electrically connected to the first metal elements 401 through a first through hole K1, and then the first metal elements 401 and the first pad 201 may be electrically connected through a second through hole K2. Correspondingly, the light-emitting device 30 may be bonded to the corresponding pad group 20, to achieve the electrical connection between the thin film transistor T and the light-emitting device 30, and the transmission of the driving signal may be realized.

Optionally, as shown in FIG. 15, the second metal elements 402 may be located in the first metal layer 40. Correspondingly, in the direction perpendicular to the plane where the substrate 10 is located, the first metal elements 401 and the drain TD located in the second metal layer 50 may be disposed directly under the first pad 201. To further reduce the height difference between the first pad 201 and the second pad 202, the second metal layer 50 in this embodiment may further include a first metal cushion layer 501. The first metal cushion layer 501 may be located directly under the second pad 202, that is, located directly under the second metal elements 402. By providing the first metal cushion layer 501 in the second metal layer 50, the position of the second pad 202 may be further raised to keep the first pad 201 and the second pad 202 on the same level as much as possible. It can be understood that the first metal cushion layer 501 may be multiplexed as a data line in the display panel 000, that is, an original metal structure that may exist in the second metal layer 50 in the display panel may be used as the first metal cushion layer 501, therefore the transmission rate of the display panel may be prevented from being affected by the additional cushion layer structure in the display panel 000.

Further, as shown in FIG. 15, when the first metal elements 401 and the second metal elements 402 are symmetrical about a symmetry axis, the drain TD of the thin film transistor T and the first metal pad layer 501 may also be symmetrical about the symmetry axis in the second metal layer 50, which is beneficial to make the cushion effect of the drain TD of the thin film transistor T and the first metal pad layer 501 uniform. Therefore, the first metal elements 401 and the second metal elements 402 may be prevented from having a large height difference and affecting the flatness induced by the cushion difference of the drain TD of the thin film transistor T and the first metal cushion layer 501.

As shown in FIG. 16, in one embodiment, the first metal elements 401 and/or the second metal elements 402 may be disposed in the second metal layer 50. That is, when the first metal elements 401 and the second metal elements 402 are arranged in the same layer, they may both be located in the second metal layer 50 where the source TS and/or the drain TD of the thin film transistor T are located, and the second metal layer 50 where the first metal elements 401 and the second metal elements 402 are located may be a metal film layer closest to the plurality of pad groups 20. To provide the driving signal for the light-emitting device 30, the drain TD of the thin-film transistor T may need to be electrically connected to the first pin (anode pin) of the light-emitting device 30. Therefore, the drain TD of the thin-film transistor T may be connected to the first metal elements 401 at the same layer, for example, through direct contact to achieve electrical connection (it can be understood that the drain TD of the thin film transistor T at this time may also be understood as the first metal elements 401, that is, two first metal elements 401 that are in direct contact may be disposed under the first pad, and the overall overlap area of the first metal elements 401 with the first pad 201 may be S1), and may be then electrically connected to the first pad 201 through a third through hole K3. After the light-emitting device 30 is bonded to the corresponding pad group 20, the effect of electrical connection between the thin film transistor T and the light-emitting device 30 may be achieved, thereby realizing the transmission of the driving signal.

Optionally, as shown in FIG. 16, in this embodiment, when the first metal elements 401 and the second metal elements 402 are symmetrical about an axis of symmetry, the overall structure formed by the drain TD of the thin film transistor T and the first metal elements 401 may be also symmetrical to the second metal elements 402 about the symmetry axis in the second metal layer 50, which is beneficial to make the cushion effect of the drain TD of the thin film transistor T and the first metal pad layer 501 uniform. Therefore, the first metal elements 401 and the second metal elements 402 may be prevented from having a large height difference and affecting the flatness.

As shown in FIG. 17, in one embodiment, the first metal elements 401 and/or the second metal elements 402 may be disposed in the second metal layer 50. That is, when the first metal elements 401 and the second metal elements 402 are arranged in the same layer, they may both be located in the second metal layer 50 where the source TS and/or the drain TD of the thin film transistor T are located, and the second metal layer 50 where the first metal elements 401 and the second metal elements 402 are located may be a metal film layer closest to the plurality of pad groups 20. To provide the driving signal for the light-emitting device 30, the drain TD of the thin-film transistor T may need to be electrically connected to the first pin (anode pin) of the light-emitting device 30. Therefore, the drain TD of the thin-film transistor T may be understood as the first metal elements 401, that is, the drain TD of the thin-film transistor T may be multiplexed as the first metal elements 401. The first metal elements 401 may be then electrically connected to the first pad 201 through a fourth through hole K4, to achieve the electrical connection of the drain TD of the thin film transistor T and the first pad 201. After the light-emitting device 30 is bonded to the corresponding pad group 20, the effect of electrical connection between the thin film transistor T and the light-emitting device 30 may be achieved, thereby realizing the transmission of the driving signal.

Optionally, as shown in FIG. 17, in this embodiment, when the first metal elements 401 and the second metal elements 402 are symmetrical about an axis of symmetry, the drain TD of the thin film transistor T multiplexed as the first metal elements 401 may be also symmetrical to the second metal elements 402 about the symmetry axis in the second metal layer 50, which is beneficial to make the cushion effect of the drain TD of the thin film transistor T and the first metal pad layer 501 uniform. Therefore, the first metal elements 401 and the second metal elements 402 may be prevented from having a large height difference and affecting the flatness.

In some embodiments, as shown in FIG. 1, FIG. 2, FIG. 5, FIG. 6, and FIGS. 15-17, in one pad group 20 of the plurality of pad groups 20 corresponding to one same light-emitting device 30, along the direction Z perpendicular to the plane of the substrate 10, there may be M first metal elements 401 at least partially overlapping the first pad 201, and there may be N second metal elements 402 at least partially overlapping the second pad 202, where M=N and M and N may both be integers larger than or equal to 0.

In one pad group 20 of the plurality of pad groups 20 corresponding to one same light-emitting device 30, along the direction Z perpendicular to the plane of the substrate 10, there may be M first metal elements 401 at least partially overlapping the first pad 201, and there may be N second metal elements 402 at least partially overlapping the second pad 202. M may be equal to N. In one embodiment shown in FIG. 2, in one same metal film layer, there may be one first metal elements 401 at least partially overlapping the first pad 201, and there may be one second metal elements 402 at least partially overlapping the second pad 202. In one embodiment shown in FIG. 5, in one same metal film layer, there may be two first metal elements 401 at least partially overlapping the first pad 201, and there may be two second metal elements 402 at least partially overlapping the second pad 202. By setting the number M of first metal elements 401 at least partially overlapping the first pad 201 the number N of the second metal elements 402 at least partially overlapping the second pad 202 equal in the same metal film layer, the first metal elements 401 and the second metal elements 402 may be prevented from having a large height difference along the direction Z perpendicular to the plane of the substrate 10, and the flatness of the first pad 201 and the second pad 202 corresponding to the same light-emitting device may be improved.

As shown in FIG. 2, in some embodiments, along the direction Z perpendicular to the plane of the substrate 10, the number M of first metal elements 401 in different metal film layers at least partially overlapping the first pad 201 may be 1, and the number N of the second metal elements 402 in different metal film layers at least partially overlapping the second pad 202 may be 1. As shown in FIG. 6, in another embodiment, along the direction Z perpendicular to the plane of the substrate 10, the number M of first metal elements 401 in different metal film layers at least partially overlapping the first pad 201 may be 2, and the number N of the second metal elements 402 in different metal film layers at least partially overlapping the second pad 202 may be 2.

In one embodiment shown in FIG. 15, the first metal elements 401 located in the first metal layer 40 may be understood as one first metal elements 401 overlapping the first pad 201, and the drain TD of the thin film transistor T located in the second metal layer 50 may be understood as another first metal elements 401 overlapping the first pads 201. That is, the number M of the first metal elements 401 at least partially overlapping the first pad 201 in FIG. 15 may be two. The second metal elements 402 located in the first metal layer 40 may be understood as one second metal elements 402 overlapping the second pad 202, and the first metal cushion layer 501 located in the second metal layer 50 may be understood as another second metal elements 402 overlapping the second pads 202. That is, the number N of the second metal elements 402 at least partially overlapping the second pads 202 in FIG. 15 may be two.

In one embodiment shown in FIG. 16, the first metal elements 401 located in the second metal layer 50 and the drain TD of the thin film transistor T may be understood as one first metal elements 401 overlapping the first pad 201. That is, the number M of the first metal elements 401 at least partially overlapping the first pad 201 in FIG. 16 may be one. Similarly, the second metal elements 402 located in the second metal layer 50 in FIG. 16 may be understood as one second metal elements 402 overlapping the second pad 202. That is, the number N of the second metal elements 402 at least partially overlapping the second pad 202 in FIG. 16 may be one.

In one embodiment shown in FIG. 17, the first metal elements 401 located in the second metal layer 50 and multiplexed as the drain TD of the thin film transistor T may be understood as one first metal elements 401 overlapping the first pad 201. That is, the number M of the first metal elements 401 at least partially overlapping the first pad 201 in FIG. 17 may be understood as one. Similarly, the second metal elements 402 located in the second metal layer 50 in FIG. 17 may be understood as one second metal elements 402 overlapping the second pad 202. That is, the number N of the second metal elements 402 at least partially overlapping the second pad 202 in FIG. 17 may also be understood as one.

In some embodiments, as shown in FIG. 1, FIG. 2, and FIG. 18 which is another cross-sectional view of the display panel in FIG. 1 along the A-A' direction, in one pad group 20 of the plurality of pad groups 20, along the direction Z perpendicular to the plane of the substrate 10, a minimum distance H1 between the first pad 201 and the substrate 10 may be equal to a minimum distance H2 between the second pad 202 and the substrate.

In the present embodiment, to prevent the first metal elements 401 and the second metal elements 402 from having a large height difference along the direction Z perpendicular to the plane of the substrate 10 and improve the flatness of the first pad 201 and the second pad 202 corresponding to the same light-emitting device 30, it may be configured that the minimum distance H1 between the first pad 201 and the substrate 10 and the minimum distance H2 between the second pad 202 and the substrate along the direction Z perpendicular to the plane of the substrate 10 are substantially equal or exactly equal. There may be process errors during the manufacturing process, and the minimum distance H1 from the first pad 201 to the substrate 10 and the minimum distance H2 from the second pad 202 to the substrate 10 may not be exactly equal, but only need to satisfy $|H1-H2| \leq 0.5$ μm such that the first pad 201 and the second pad 202 corresponding to the same light-emitting device 30 can be on the same level as much as possible. Therefore, the bonding yield of the light-emitting device 30 may be improved.

Figures 19, 20:
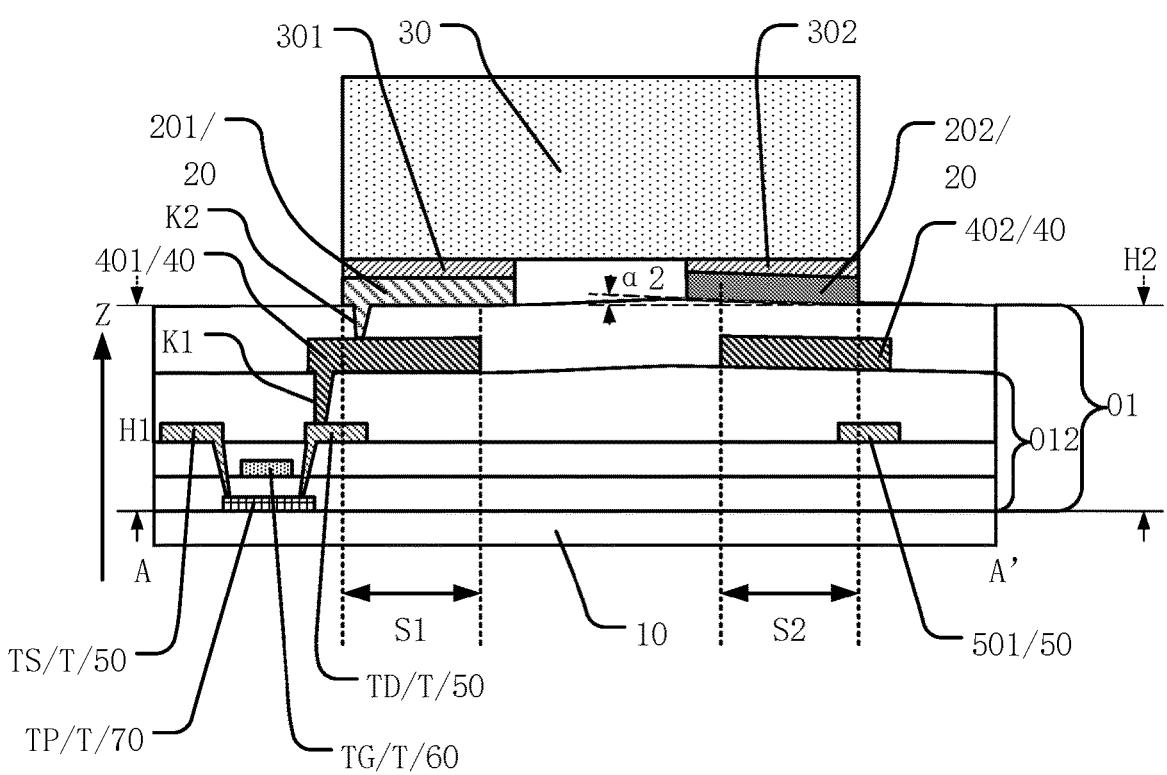
FIG. 19 illustrates another cross-sectional view of the display panel in FIG. 1 along an A-A' direction.
FIG. 20 illustrates another cross-sectional view of the display panel in FIG. 1 along an A-A' direction.

As shown in FIG. 18, the minimum distance H1 from the first pad 201 to the substrate 10 may be understood as the difference between the side surface of the first pad 201 facing the substrate 10 and the side surface of the substrate 10 facing the first pad 201. In specific implementation, because of the existence of process errors, the surface of the first pad 201 facing the substrate 10 side may not necessarily be a horizontal plane, but an inclined surface as shown in FIG. 18. The surface of the second pad 202 facing the substrate 10 side may be a horizontal plane. Therefore, the minimum distance H1 from the first pad 201 to the substrate 10 may be understood as a distance between a point closest to the substrate 10 on the side surface of the first pad 201 facing the substrate 10 and the substrate 10. Similarly, because of process errors, the side surface of the second pad 202 facing the substrate 10 may not necessarily a horizontal plane, but an inclined plane as shown in FIG. 19. The side surface of the first pad 201 facing the substrate 10 may be a horizontal plane. Therefore, the minimum distance H2 from the second pad 202 to the substrate 10 may be understood as a distance between a point closest to the substrate 10 on the side surface of the second pad 202 facing the substrate 10 and the side surface of the substrate 10 facing the second pad 202. In another embodiment shown in FIG. 20 which is another schematic cross-sectional view in the direction of AA' in FIG. 1, because of process errors, the side surface of the first pad 201 facing the substrate 10 side may not necessarily be a horizontal plane, and the side surface of the second pad 202 facing the substrate 10 may not necessarily a horizontal plane. Therefore, the minimum distance H1 from the first pad 201 to the substrate 10 may be understood as a distance between a point closest to the substrate 10 on the side surface of the first pad 201 facing the substrate 10 and the substrate 10, and the minimum distance H2 from the second pad 202 to the substrate 10 may be understood as a distance between a point closest to the substrate 10 on the side surface of the second pad 202 facing the substrate 10 and the side surface of the substrate 10 facing the second pad 202.

Further, as shown in FIG. 18 to FIG. 20, the side surface of the first pad 201 facing the substrate 10 may not necessarily be a horizontal plane, but an inclined surface, because of the process error. An angle between the side surface of the first pad 201 facing the substrate 10 and the horizontal plane may be al, and the angle α1 may be configured to be smaller than 3°. When the angle α1 is in this range, the side surface of the first pad 201 facing the substrate 10 may be considered to be a horizontal plane, to avoid unreliable bonding because of a too small bonding area of the first pin 301 of the light-emitting device 30 induced by a too large inclination of the first pad 201. Similarly, the side surface of the second pad 202 facing the substrate 10 may not necessarily be a horizontal plane, but an inclined surface, because of the process error. An angle between the side surface of the second pad 202 facing the substrate 10 and the horizontal plane may be α2, and the angle α2 may be configured to be smaller than 3°. When the angle α2 is in this range, the side surface of the second pad 202 facing the substrate 10 may be considered to be a horizontal plane, to avoid unreliable bonding because of a too small bonding area of the second pin 302 of the light-emitting device 30 induced by a too large inclination of the second pad 202.

For description purposes only, the embodiments in FIG. 18 to FIG. 20 where one end of the first pad 201 facing the second pad 202 is inclined in a direction away from the substrate 10 and/or one end of the second pad 202 towards the first pad 201 is inclined in the direction away from the substrate 10 are used as examples to illustrate the present disclosure and does not limit the scope of the present disclosure. In various embodiments, the inclination manner of the first pad 201 and the second pad 202 includes, but is not limited to, the above embodiments. For example, it may be also possible that the end of the first pad 201 facing the second pad 202 is inclined in the direction away from the substrate 10 and one end of the second pad 202 away from the first pad is inclined in the direction away from the substrate 10, or one end of the first pad 201 away from the second pad 202 is inclined in the direction away from the substrate 10 and the end of the second pad 202 towards the first pad 202 is inclined in the direction away from the substrate 10. The present disclosure has no limit on this, as long as that the angle α1 between the side surface of the first pad 201 facing the substrate 10 and the horizontal plane is smaller than 3° when the side surface of the first pad 201 facing the substrate 10 is an inclined surface such that the side surface of the first pad 201 facing the substrate 10 may be considered to be a horizontal plane, and the angle α2 between the side surface of the second pad 202 facing the substrate 10 and the horizontal plane is smaller than 3° when the side surface of the second pad 202 facing the substrate 10 is an inclined surface such that the side surface of the second pad 202 facing the substrate 10 may be considered to be a horizontal plane. The flatness of the two pads may be ensured and the bonding effect of the light-emitting device may be improved.

Figures 21, 22:
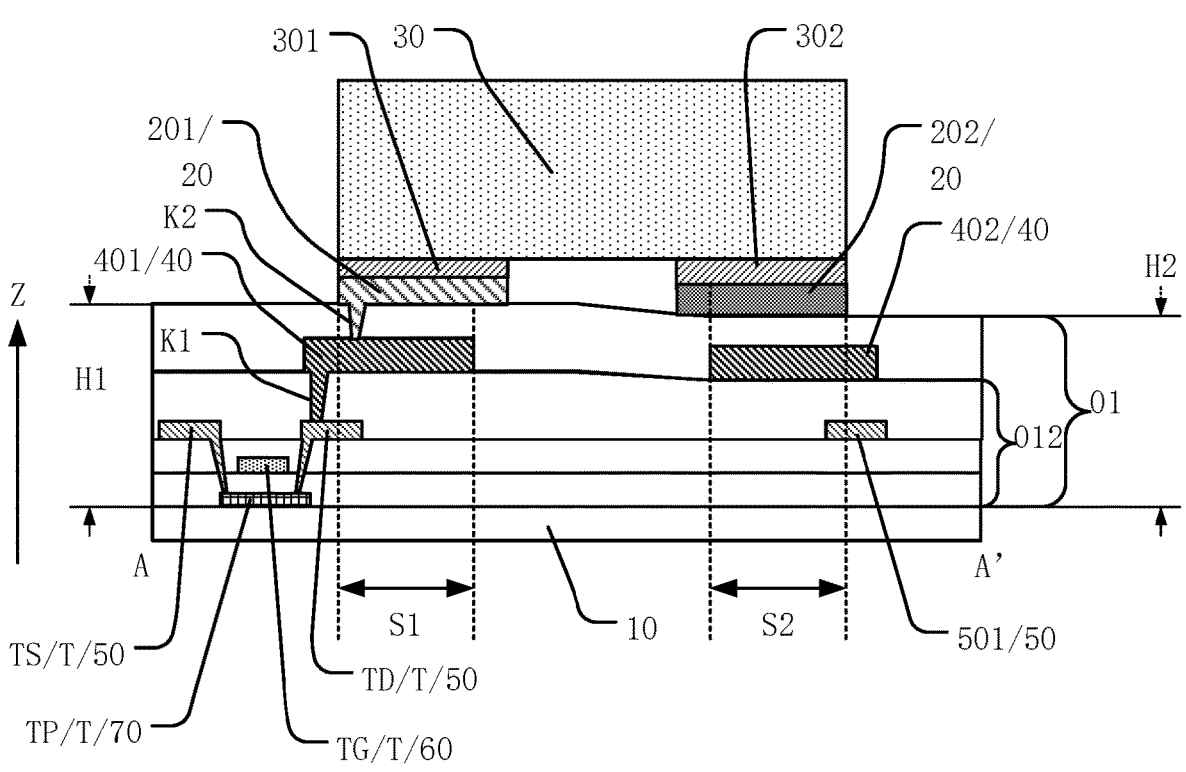
FIG. 21 illustrates another cross-sectional view of the display panel in FIG. 1 along an A-A' direction.
FIG. 22 illustrates another cross-sectional view of the display panel in FIG. 1 along an A-A' direction.

In another embodiment shown in FIG. 21 which is another cross-sectional view of the display panel along the A-A' direction in FIG. 1 and FIG. 22 which is another cross-sectional view of the display panel along the A-A' direction in FIG. 1, the minimum distance H1 from the first pad 201 to the substrate 10 may be understood as a minimum distance between the side surface of the first pad 201 facing the substrate 10 and the side surface of the substrate 10 facing the first pad 201, and the minimum distance H2 from the second pad 202 to the substrate 10 may be understood as a minimum distance between the side surface of the second pad 202 facing the substrate 10 and the side surface of the substrate 10 facing the second pad 202. In practical implementation, because of process error, although the side surface of the substrate 10 facing the first pad 201 is a horizontal plane and the side surface of the second pad 202 facing the substrate 10 is a horizontal plane, the side surface of the substrate 10 facing the first pad 201 and the side surface of the second pad 202 facing the substrate 10 may be not on a same level, such that the minimum distance H1 from the first pad 201 to the substrate 10 and the minimum distance H2 from the second pad 202 to the substrate 10 may be not exactly equal. As long as |H1−H2|≤0.5 μm, it may be considered that the first pad 201 and the second pad 202 corresponding to the same light-emitting device 30 are on the same level.

Figure 23:
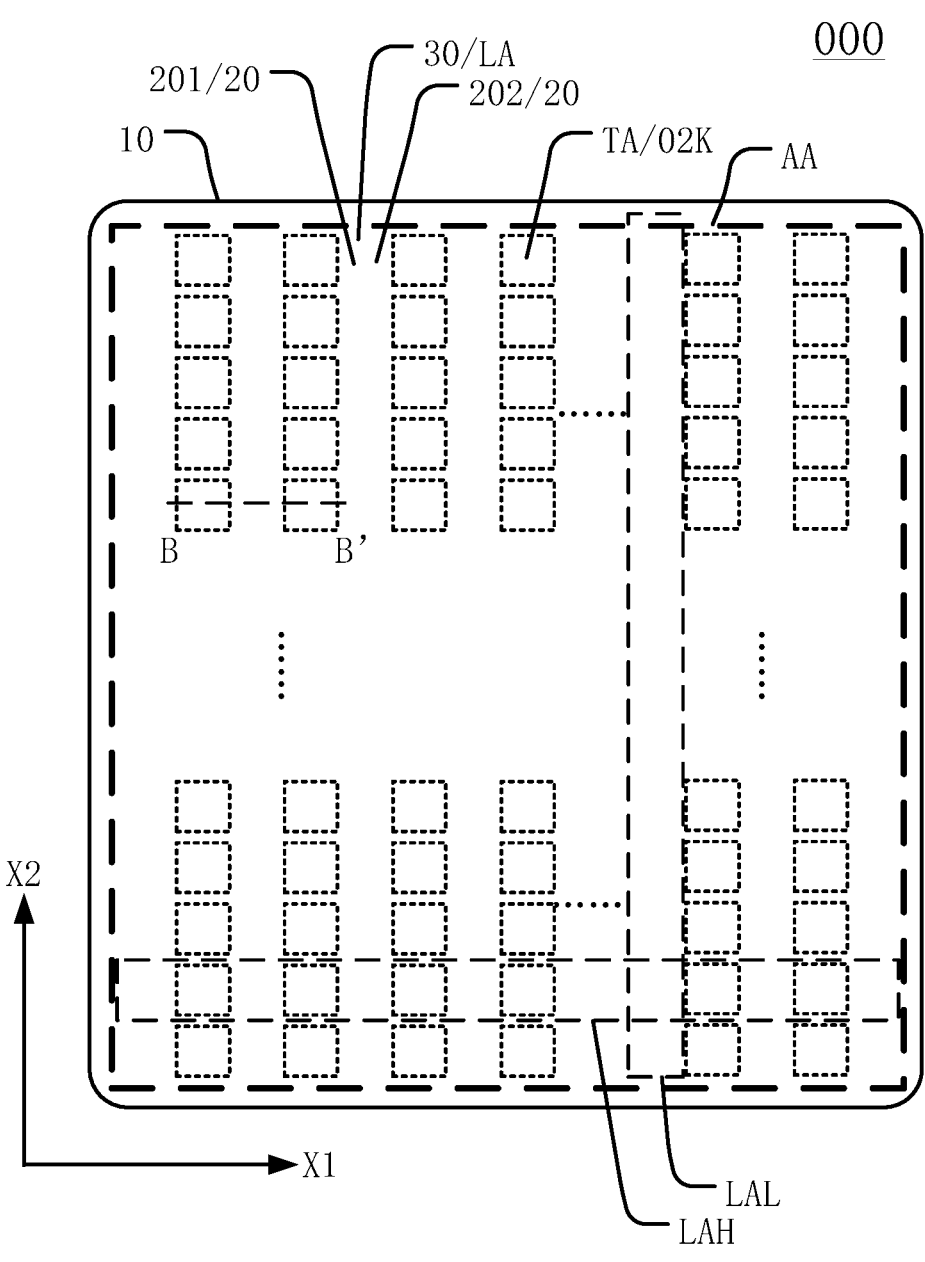
FIG. 23 illustrates a planar structure of another exemplary display panel consistent with various disclosed embodiments in the present disclosure.
Figure 24:
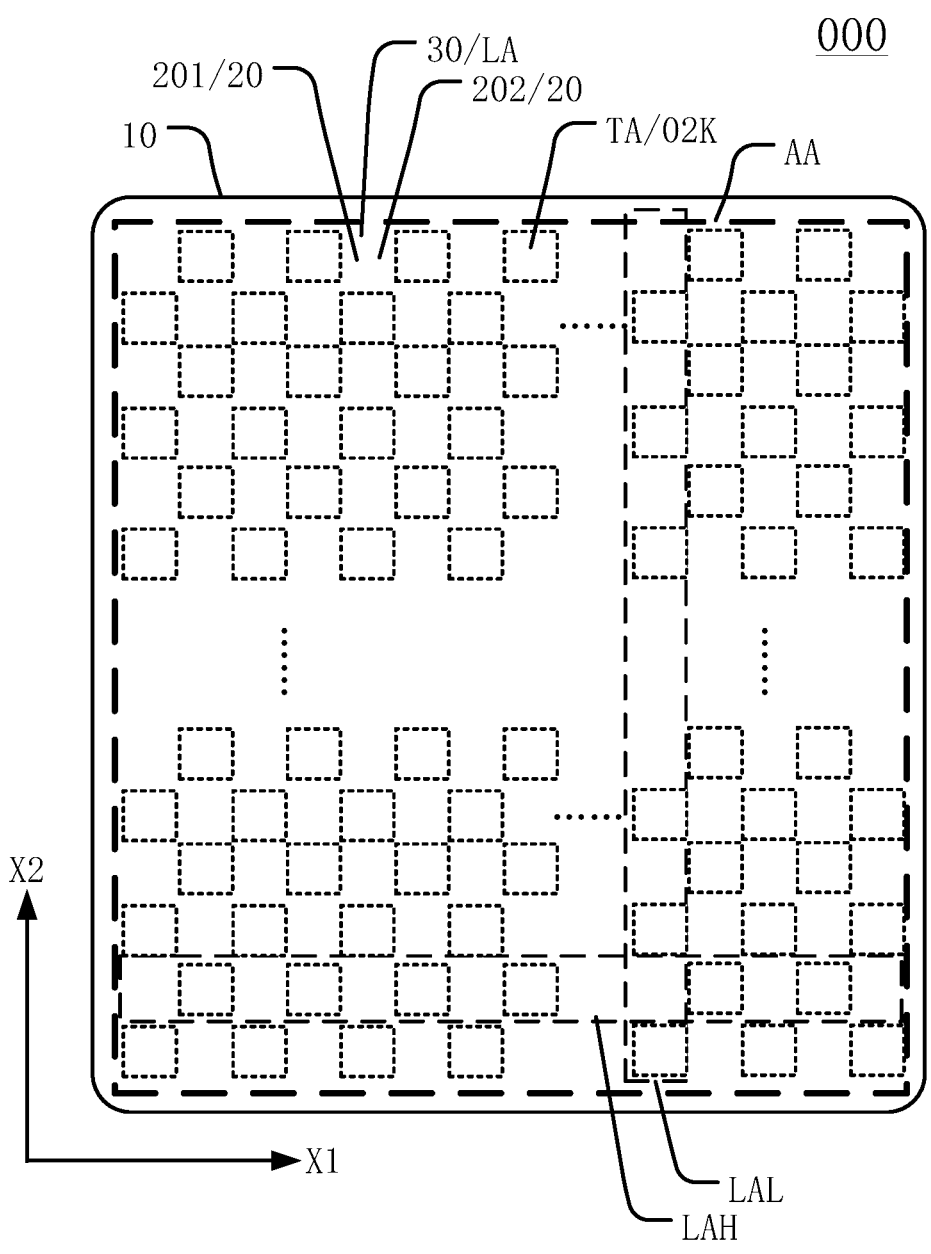
FIG. 24 illustrates a planar structure of another exemplary display panel consistent with various disclosed embodiments in the present disclosure.
Figure 25:
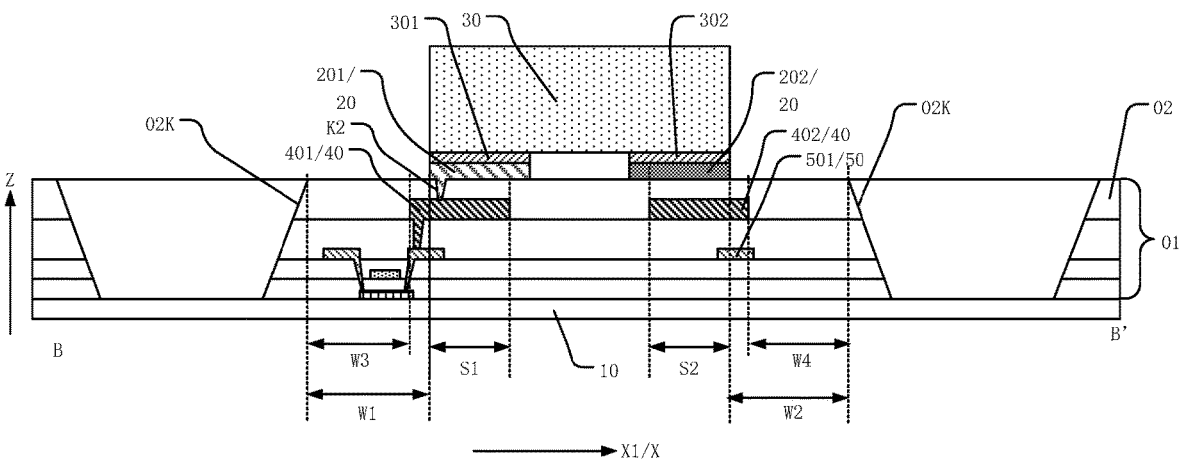
FIG. 25 illustrates a cross-sectional view of the display panel in FIG. 23 along a B-B' direction.
Figure 26:
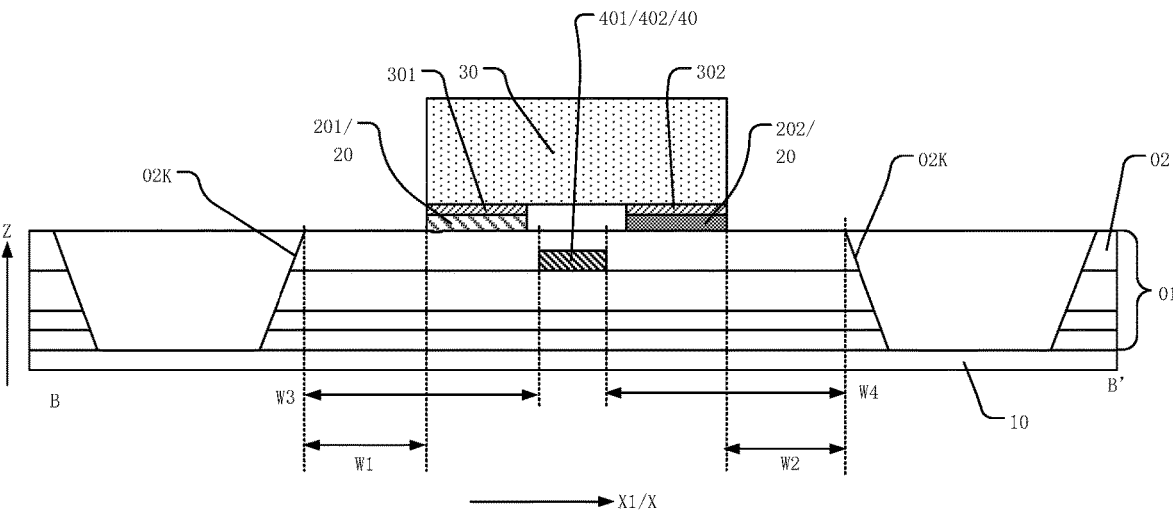
FIG. 26 illustrates another cross-sectional view of the display panel in FIG. 23 along a B-B' direction.
Figure 27:
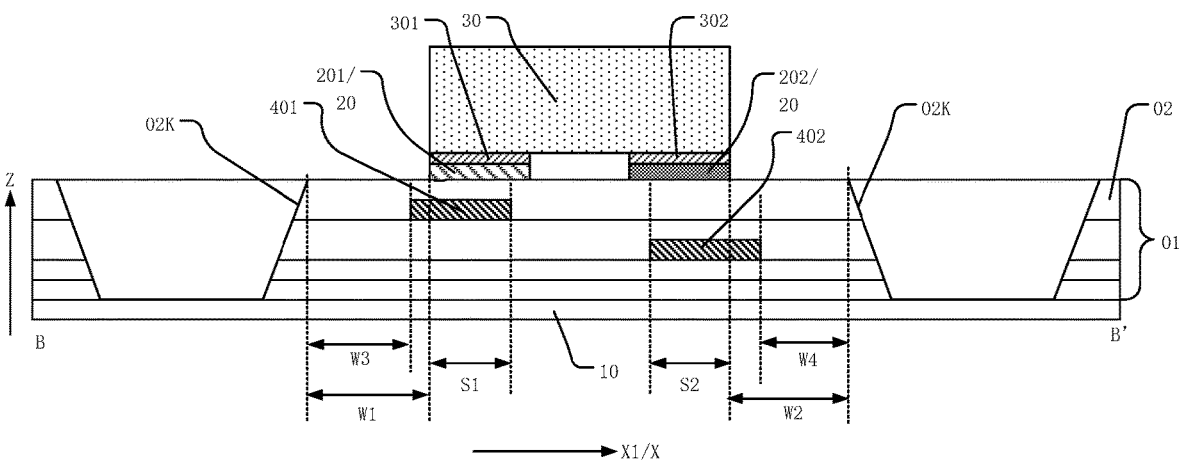
FIG. 27 illustrates another cross-sectional view of the display panel in FIG. 23 along a B-B' direction.
Figures 28, 29:
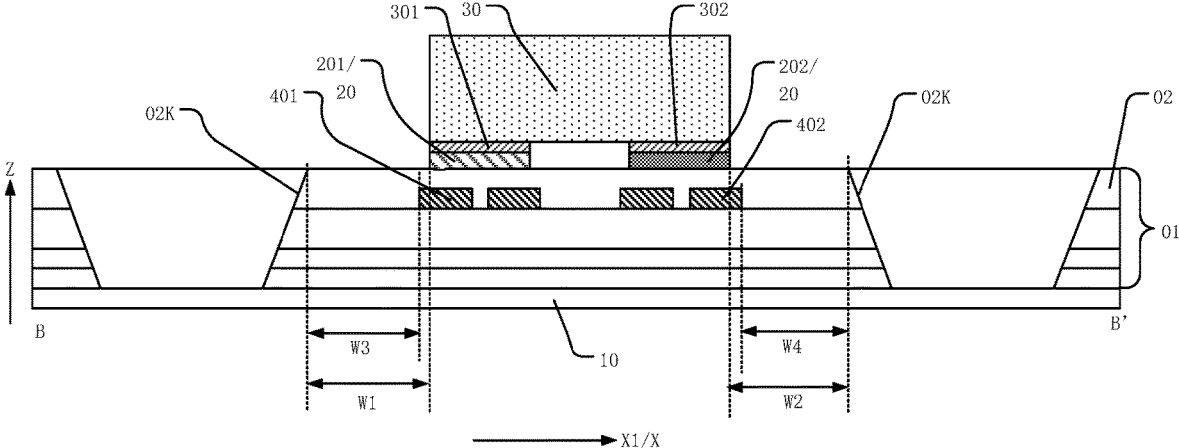
FIG. 28 illustrates another cross-sectional view of the display panel in FIG. 23 along a B-B' direction.
FIG. 29 illustrates another cross-sectional view of the display panel in FIG. 23 along a B-B' direction.

In some embodiments shown in FIG. 23 which illustrates another planar structure of a display panel, FIG. 24 which illustrates another planar structure of a display panel, FIG. 25 which is a cross-sectional view of the display panel along a B-B' direction in FIG. 23, FIG. 26 which is another cross-sectional view of the display panel along a B-B' direction in FIG. 23, FIG. 27 which is another cross-sectional view of the display panel along a B-B' direction in FIG. 23, FIG. 28 which is another cross-sectional view of the display panel along a B-B' direction in FIG. 23, and FIG. 29 which is another cross-sectional view of the display panel along a B-B' direction in FIG. 23 (To clearly illustrate the structure, FIG. 23 and FIG. 24 are filled with transparency), the display panel 000 may further include a plurality of light-emitting regions LA and a plurality of light-transmitting regions TA. Each of the plurality of light-emitting regions LA may include at least one light-emitting device 30. An orthographical projection of one of the plurality of pad groups 20 may be located in a corresponding one of the light-emitting regions LA.

The display panel 000 may further include at least one insulating layer 02. The at least one insulating layer 02 may be located on a side of the plurality of pad groups 20 close to the substrate 10. The at least one insulating layer 02 may include through holes 02K in the plurality of light-transmitting regions TA.

In one pad group 20 of the plurality of pad groups 20, along the direction X parallel to the plane of the substrate 10, a minimum distance between the first pad 201 to one corresponding through hole 02K may be W1, and a minimum distance between the second pad 202 to one corresponding through hole 02K may be W2, where |W1−W2|≤1.1 μm.

In the present disclosure, the display panel 000 may be a transparent display panel. The display region of the display panel 000 may include a transparent display region AA, and the transparent display region AA may include the plurality of light-emitting regions LA and the plurality of light-transmitting regions TA. Along the plane parallel to the substrate 10, the plurality of light-transmitting region TA may be arranged adjacent to the plurality of light-emitting region LA, and the transmittance of the plurality of light-transmitting regions TA may be larger than the transmittance of the plurality of light-emitting regions LA. Optionally, as shown in FIG. 23, the plurality of light-emitting regions LA in this embodiment may be arranged in an array. Some of the plurality of light-emitting regions LA may be arranged along the first direction X1 to form a light-emitting region row LAH, and some of the plurality of light-emitting regions LA may be arranged along the second direction X2 to form a light-emitting region column LAL. In two adjacent light-emitting region rows LAH, the two light-emitting region LA may be located in one same light-emitting region column LAL. The first direction X1 and the second direction X2 may intersect in the direction X parallel to the plane where the substrate 10 is located. In the figures, the first direction X1 and the second direction X2 are perpendicular to each other, which is used as an example for illustration. Alternatively, as shown in FIG. 24, the plurality of light-emitting regions LA in this embodiment may be arranged in an array. Some of the plurality of light-emitting regions LA may be arranged along the first direction X1 to form a light-emitting region row LAH, and some of the plurality of light-emitting regions LA may be arranged along the second direction X2 to form a light-emitting region column LAL. In two adjacent light-emitting region rows LAH, the two light-emitting region LA may be located in two adjacent light-emitting region columns LAL. That is, two adjacent light-emitting regions LA in the first direction X1 may be staggered in the second direction X2, and two adjacent light-emitting regions LA in the second direction X2 may be staggered in the first direction X1. For description purposes only, the above embodiments with the arrangement of the plurality of light-emitting regions LA are used as examples to illustrate the present disclosure, and do not limit the scope of the present disclosure.

In one embodiment, each of the plurality of light-emitting regions LA may include at least one light-emitting device 30. An orthographical projection of one of the plurality of pad groups 20 may be located in a corresponding one of the light-emitting regions LA. That is, the light-transmitting region TA may be not provided with any structure that affects the light transmittance. The display panel 000 may further include at least one insulating layer 02. The at least one insulating layer 02 may be located on a side of the plurality of pad groups 20 close to the substrate 10. Optionally, the at least one insulating layer 02 may be inorganic insulating layers for insulating between the plurality of metal film layers. The at least one insulating layer 02 may include through holes 02K in the plurality of light-transmitting regions TA. Optionally, when forming the display panel 000, the through holes 02K may be filled with highly transparent materials, to further improve the transmittance of the plurality of light-transmitting regions TA of the display panel 000.

In one pad group 20 of the plurality of pad groups 20, along the direction X parallel to the plane of the substrate 10, a minimum distance between the first pad 201 to one corresponding through hole 02K may be W1, and a minimum distance between the second pad 202 to one corresponding through hole 02K may be W2. The minimum distance W1 between the first pad 201 and one corresponding through hole 02K may be, along the direction X parallel to the plane of the substrate 10 between the first pad 201 and one through hole 02K closest to the first pad 201, a distance W1 between an edge of the first pad 201 facing the through hole 02K and an edge of the through hole 02K facing the first pad 201. The minimum distance W2 between the second pad 202 and one corresponding through hole 02K may be, along the direction X parallel to the plane of the substrate 10 between the second pad 202 and one through hole 02K closest to the second pad 202, a distance W2 between an edge of the second pad 202 facing the through hole 02K and an edge of the through hole 02K facing the second pad 202. W1 and W2 may be substantially same or exactly same. Because of process error in the fabrication, W1 and W2 may be not exactly same. As long as |W1−W2|≤1.1 μm, it may be considered that the minimum distance W1 between the first pad 201 and one corresponding through hole 02K and the minimum distance W2 between the second pad 202 and one corresponding through hole 02K may be substantially same or exactly same.

In the present embodiment, by setting the minimum distance W1 between the first pad 201 and one corresponding through hole 02K and the minimum distance W2 between the second pad 202 and one corresponding through hole 02K to be approximately equal, the distance between the first pad 201 and the through hole 02K closest to the first pad 201, and the distance between the second 202 and the through hole 02K closest to the second pad 202, may be approximately consistent. In existing technologies, the plurality of light-transmitting regions TA may be usually formed by opening penetration holes in the at least one inorganic insulating layers on the substrate 10 where the penetration holes expose the surface of the substrate 10 and are located in the plurality of light-transmitting regions TA. In the present embodiment, the through holes 02K in the insulating layer 02 may be through holes 02K formed in the insulating layer 02 when forming the penetration holes. After forming the penetration holes exposing the surface of the substrate 10, an insulating organic material layer (such as an insulating organic material layer below the first metal elements 401 in FIG. 25) may need to be used to fill the penetration holes. Since the depth of the penetration holes may not be filled when using the insulating organic material layer to fill and cover the penetration holes, there may be a height difference between the positions of the penetration holes and other positions where the penetration holes are not opened, resulting in a leveling difference when forming the insulating layer to planarizing the first metal elements 401 and the second metal elements 402 (such as that the insulating layer 02 as shown in FIG. 25 may be a planarization layer) and poor flatness. Further, when the distance from the first pad 201 to the closest through hole 02K and the distance from the second pad 202 to the closest through hole 02K are inconsistent, there may also be differences between the inclination of the first pad 201 and the first pad 201 due to the leveling difference. Therefore, in this embodiment, the distance from the first pad 201 to the nearest through hole 02K and the distance from the second pad 202 to the nearest through hole 02K may be set to be basically the same, such that the inclination of the first pad 201 and the second pad 202 may be basically the same when film layers under the pad group 20 have a leveling difference problem. The height difference between the first pad 201 and the second pad 202 in the direction Z perpendicular to the plane of the substrate 10 may be avoided, such that the first pad 201 and the second pad 202 corresponding to the same light-emitting device 30 may be on the same level as much as possible, to improve the flatness of the first pad 201 and the second pad 202 of the pad group 20, and improve product yield.

In some embodiments shown in FIG. 23 to FIG. 29, the plurality of light-transmitting regions TA may be arranged along the first direction X1. There may be one pad group 20 between two adjacent light-transmitting regions TA along the first direction X1, and the first pad 201 and the second pad in the pad group 20 may be also arranged along the first direction X1. Therefore, along the first direction X1, the through hole 02K closest to the first pad 201 and the through hole 02K closest to the second pad 201 may be two different through holes on opposite sides of the corresponding light-transmitting region TA. The minimum distance W1 from the first pad 201 to the through hole 02K and the minimum distance W2 from the second pad 202 to the through hole 02K may be as shown in FIG. 23 to FIG. 25.

Figure 30:
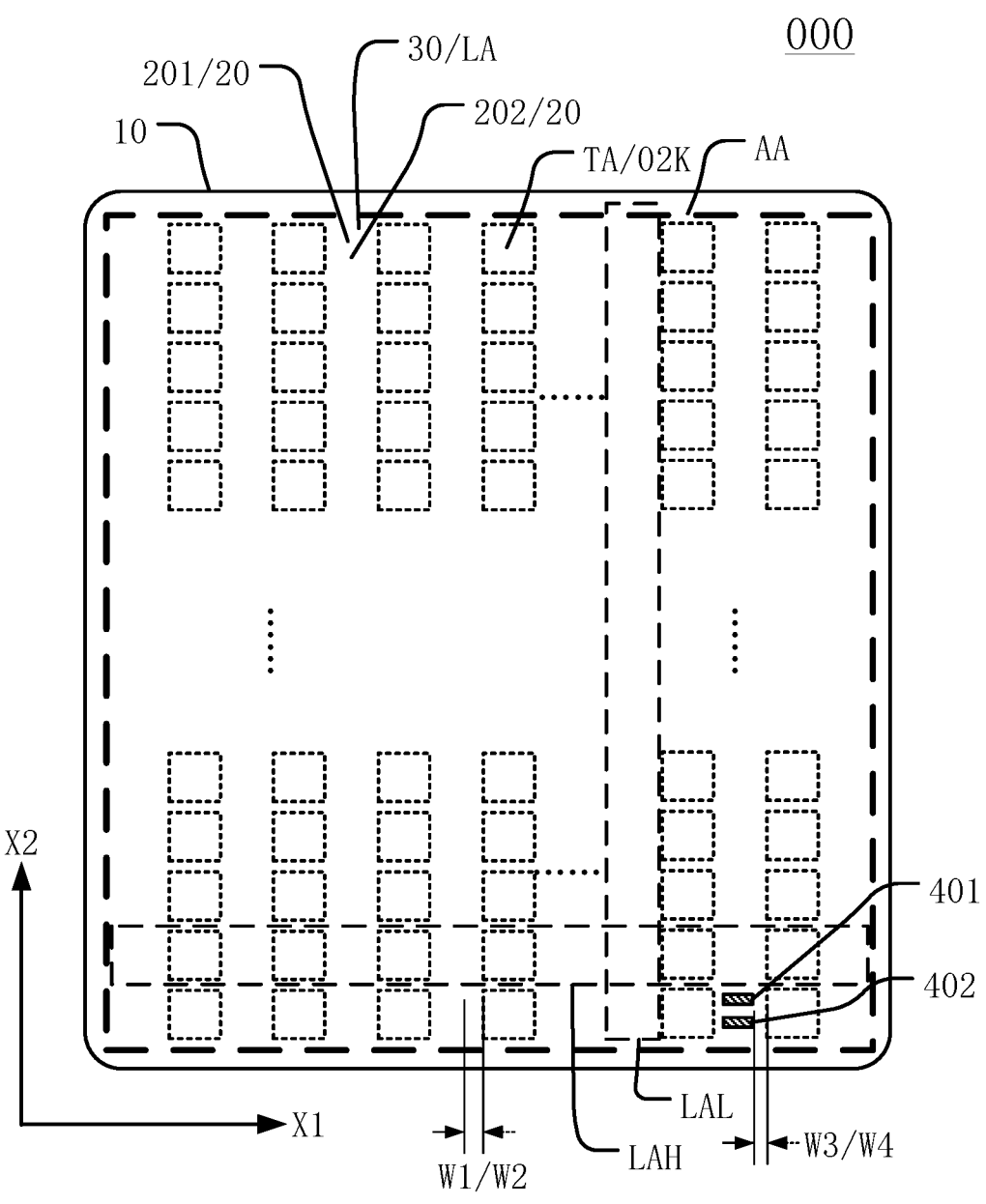
FIG. 30 illustrates a planar structure of another exemplary display panel consistent with various disclosed embodiments in the present disclosure.

In another embodiment shown in FIG. 30 which is another planar structure of a display panel (To clearly illustrate the structure, FIG. 30 is filled with transparency), the plurality of light-transmitting regions TA may be arranged along the first direction X1. There may be one pad group 20 along the first direction X1 between two adjacent light-transmitting regions TA, and the first pad 201 and the second pad 202 in the pad group 20 may be arranged along the second direction X2. Therefore, along the first direction X1, the through hole 02K closest to the first pad 201 and the through hole 02K closest to the second pad 201 may be the same through hole on the same side of the corresponding light-transmitting region TA. The minimum distance W1 from the pad 201 to the through hole 02K and the minimum distance W2 from the second pad 202 to the through hole 02K may be as shown in FIG. 30.

For description purposes only, the above embodiments are used as examples to illustrate the present disclosure, and the present disclosure has no limit on the arrangement of the first pad 201 and the second pad 202 in the pad group 20. In various embodiments, the arrangement of the first pad 201 and the second pad 202 in one pad group 20 between two adjacent light-transmitting regions TA may be configured according to actual needs.

As shown in FIG. 26 to FIG. 29, the first metal elements 401 and the second metal elements 402 may be arranged in the same layer, or the first metal elements 401 and the second metal elements 402 may be arranged in different layers. The first pads 201 in one pad group 20 may correspond to a plurality of first metal elements 401, and the second pads 202 in one pad group 20 may correspond to a plurality of second metal elements 402. For details, please refer to the description in the above-mentioned embodiment. The arrangement of the first metal elements 401 and the second metal elements 402 may effectively solve the problem of the film layer inclination caused by the leveling difference of the film layers under the plurality of pad group 20, to ensure the first pad 201 and the second pad 202 in one pad group 20 between two adjacent light-transmitting regions TA are on the same level as much as possible and to ensure the bonding effect of the light-emitting device 30.

In one embodiment, in one pad group 20 of the plurality of pad groups 20, along the direction X parallel to the plane of the substrate 10, a minimum distance between the first pad 201 to one corresponding through hole 02K may be W1, and a minimum distance between the second pad 202 to one corresponding through hole 02K may be W2, where W1≥7.5 μm, W2≥7.5 μm.

In the present embodiment, the display panel 000 may be a transparent display panel. The display panel 000 may further include at least one insulating layer 02. The at least one insulating layer 02 may be located on a side of the plurality of pad groups 20 close to the substrate 10. When forming the through holes 02K in the at least one insulating layer 02 at positions of the plurality of light-transmitting regions TA in the transparent display panel, to avoid unevenness caused by excessive inclination of the first pad 201 and the second pad 202 due to the leveling difference of the film layers under the pad group 20, in the direction X of the plane where the bottom 10 is located, the minimum distance W1 from the first pad 201 to the through hole 02K and the minimum distance W2 from the second pad 202 to the through hole 02K may be configured to be larger than or equal to 7.5 μm. The minimum distance W1 between the first pad 201 and one corresponding through hole 02K may be, along the direction X parallel to the plane of the substrate 10 between the first pad 201 and one through hole 02K closest to the first pad 201, a distance W1 between an edge of the first pad 201 facing the through hole 02K and an edge of the through hole 02K facing the first pad 201. The minimum distance W2 between the second pad 202 and one corresponding through hole 02K may be, along the direction X parallel to the plane of the substrate 10 between the second pad 202 and one through hole 02K closest to the second pad 202, a distance W2 between an edge of the second pad 202 facing the through hole 02K and an edge of the through hole 02K facing the second pad 202. Along the direction X parallel to the plane of the substrate 10, when the minimum distance W1 from the first pad 201 to the through hole 02K and the minimum distance W2 from the second pad 202 to the through hole 02K are too small, for example, smaller than 7.5 μm, the insulating layer 02 may be inclined downward (towards the direction close to the substrate 10) because of forming the through holes 02K, such that the first pad 201 and the second pad 202 may be also inclined, resulting in the height difference and unevenness between the first pad 201 and the second pad 202. In this embodiment, when the minimum distance W1 between the first pad 201 and the through hole 02K and the minimum distance W2 between the second pad 202 and the through hole 02K are set to be larger than or equal to 7.5 μm, the flatness difference induced by the leveling difference of the film layers below the pad group 20 may be kept within 0.1 μm, to solve the inclination problem caused by the leveling difference because of forming the through holes 02K. Therefore, the first pad 201 and the second pad 202 may be prevented from having a height difference in the direction Z perpendicular to the plane of the substrate 10, such that the first pad 201 and the second pad 202 corresponding to the same light-emitting device 30 may be on the same level as possible. The flatness of the first pad 201 and the second pad 202 of the pad group 20 may be improved to enhance the product yield.

In some embodiments shown in FIG. 23 to FIG. 30, in one pad group 20 of the plurality of pad groups 20, along the direction X parallel to the plane of the substrate 10, a minimum distance between the metal elements 401 to one corresponding through hole 02K may be W3, and a minimum distance between the second metal elements 402 to one corresponding through hole 02K may be W4, where |W3-W4|≤1.1 μm.

In the present embodiment, the display panel 000 may be a transparent display panel. The display panel 000 may further include at least one insulating layer 02. The at least one insulating layer 02 may be located on a side of the plurality of pad groups 20 close to the substrate 10. When forming the through holes 02K in the at least one insulating layer 02 at positions of the plurality of light-transmitting regions TA in the transparent display panel, to avoid unevenness and excessive inclination of the first pad 201 and the second pad 202 caused by excessive inclination of the first metal elements 401 and the second metal elements 402 due to the leveling difference of the film layers under the pad group 20, in the direction X parallel to the plane where the bottom 10 is located, the minimum distance from the first metal elements 401 to the through hole 02K may be W3 and the minimum distance from the second metal elements 402 to the through hole 02K may be W4. The minimum distance W3 between the first metal elements 401 and one corresponding through hole 02K may be, along the direction X parallel to the plane of the substrate 10 between the first metal elements 401 and one through hole 02K closest to the first pad 201, a distance W3 between an edge of the first metal elements 401 facing the through hole 02K and an edge of the through hole 02K facing the first metal elements 401. The minimum distance W4 between the second metal elements 402 and one corresponding through hole 02K may be, along the direction X parallel to the plane of the substrate 10 between the second metal elements 402 and one through hole 02K closest to the second metal elements 402, a distance W4 between an edge of the second metal elements 402 facing the through hole 02K and an edge of the through hole 02K facing the second pad 202. W3 and W4 may be substantially same or exactly same. Because of process error in the fabrication, W3 and W4 may be not exactly same. As long as |W3-W4|≤1.1 μm, it may be considered that the minimum distance W3 between the first metal elements 401 and one corresponding through hole 02K and the minimum distance W4 between the second metal elements 402 and one corresponding through hole 02K may be substantially same or exactly same. By configuring the minimum distance W3 between the first metal elements 401 and one corresponding through hole 02K and the minimum distance W4 between the second metal elements 402 and one corresponding through hole 02K to be substantially same or exactly same, the distance from the first metal elements 401 to the through hole 02K closest to the first metal elements 401 and the distance from the second metal elements 402 to the through hole 02K closest to the second metal elements 402 may be approximately consistent. Therefore, when the leveling of the film layers under the pad group 20 is different, the inclination of the first metal elements 401 and the second metal elements 402 corresponding to one pad group 20 may be approximately consistent, to avoid the height difference of the first metal elements 401 and the second metal elements 402 in the direction Z perpendicular to the plane of the substrate 10. Therefore, the first pad 201 and the second pad 202 may be prevented from having a height difference in the direction Z perpendicular to the plane of the substrate 10, such that the first pad 201 and the second pad 202 corresponding to the same light-emitting device 30 may be on the same level as possible. The flatness of the first pad 201 and the second pad 202 of the pad group 20 may be improved to enhance the product yield.

In some embodiments shown in FIG. 23 to FIG. 29, the plurality of light-transmitting regions TA may be arranged along the first direction X1. There may be one pad group 20 between two adjacent light-transmitting regions TA along the first direction X1, and the first pad 201 and the second pad in the pad group 20 may be also arranged along the first direction X1. The first metal elements 401 and the second metal elements 402 may be also arranged along the first direction X1. The first pad 201 may correspond to at least one first metal elements 401, and the second pad 202 may correspond to at least one second metal elements 402. Therefore, along the first direction X1, the through hole 02K closest to the first metal elements 401 and the through hole 02K closest to the second metal elements 402 may be two different through holes on opposite sides of the corresponding light-transmitting region TA. The minimum distance W3 from the first metal elements 401 to the through hole 02K and the minimum distance W4 from the second metal elements 402 to the through hole 02K may be as shown in FIG. 23 to FIG. 25.

In another embodiment shown in FIG. 30 which is another planar structure of a display panel (To clearly illustrate the structure, FIG. 30 is filled with transparency), the plurality of light-transmitting regions TA may be arranged along the first direction X1. There may be one pad group 20 along the first direction X1 between two adjacent light-transmitting regions TA, and the first pad 201 and the second pad 202 in the pad group 20 may be arranged along the second direction X2. The first metal elements 401 and the second metal elements 402 may be also arranged along the first direction X1. The first pad 201 may correspond to at least one first metal elements 401, and the second pad 202 may correspond to at least one second metal elements 402. Therefore, along the first direction X1, the through hole 02K closest to the first metal elements 401 and the through hole 02K closest to the second metal elements 402 may be the same through hole on the same side of the corresponding light-transmitting region TA. The minimum distance W3 from the first metal elements 401 to the through hole 02K and the minimum distance W4 from the second metal elements 402 to the through hole 02K may be as shown in FIG. 30.

For description purposes only, the above embodiments are used as examples to illustrate the present disclosure, and the present disclosure has no limit on the arrangement of the first pad 201 and the second pad 202 in the pad group 20. In various embodiments, the arrangement of the first pad 201 and the second pad 202 in one pad group 20 between two adjacent light-transmitting regions TA may be configured according to actual needs.

As shown in FIG. 26 to FIG. 29, in some other embodiments, the first metal elements 401 and the second metal elements 402 may be arranged in the same layer, or the first metal elements 401 and the second metal elements 402 may be arranged in different layers. The first pads 201 in one pad group 20 may correspond to a plurality of first metal elements 401, and the second pads 202 in one pad group 20 may correspond to a plurality of second metal elements 402. For details, please refer to the description in the above-mentioned embodiment. The arrangement of the first metal elements 401 and the second metal elements 402 may effectively solve the problem of the film layer inclination caused by the leveling difference of the film layers under the plurality of pad group 20, to ensure the first pad 201 and the second pad 202 in one pad group 20 between two adjacent light-transmitting regions TA are on the same level as much as possible and to ensure the bonding effect of the light-emitting device 30.

Figure 31:
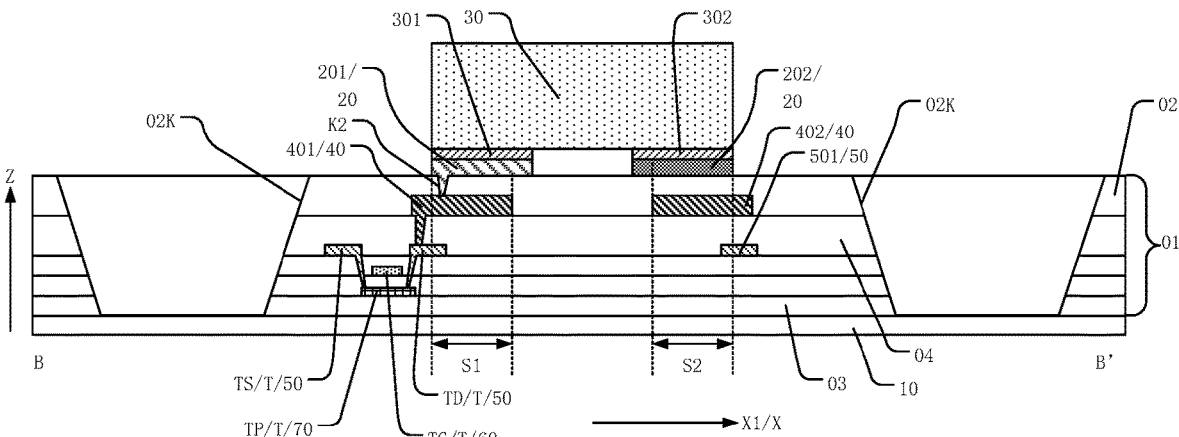
FIG. 31 illustrates another cross-sectional view of the display panel in FIG. 23 along a B-B' direction.

In one embodiment shown in FIG. 23 and FIG. 31 which is another cross-sectional view of the display panel along the B-B' direction in FIG. 23, the insulating layer 02 may be an organic layer. The organic layer may be located on a side of the first metal elements 401 and/or the second metal elements 402 close to the pad group 20, and may be in direct contact with the first metal elements 401 and/or the second metal elements 402.

In the present embodiment, the insulating layer 02 where the through hole 02K are formed may be an organic layer. The organic layer may be a planarization layer, and the insulating layer 02 made of organic materials including polyimide, acrylate, epoxy resin, or a combination thereof, may have a higher flatness. The organic layer may be located on a side of the first metal elements 401 and/or the second metal elements 402 close to the pad group 20, and may be in direct contact with the first metal elements 401 and/or the second metal elements 402. That is, the organic layer may cover the film layer where the first metal elements 401 and/or the second metal elements 402 is located. The organic layer made of organic materials may have the characteristics of high flatness, such that the side surface of the insulating layer 02 covering the first metal elements 401 and/or the first metal elements 401 away from the substrate 10 may have a high flatness, to reduce the height difference problem caused by the first metal elements 401 and/or the second metal elements 402 as much as possible. The first pad 201 and the second pad 202 of the pad group 20 formed on the side of the organic layer away from the substrate 10 may be on the same level as much as possible, to ensure the bonding yield of the light-emitting device 30.

It can be understood that, as shown in FIG. 31, the display panel may further include other insulating layers between the insulating layer 02 which is an organic layer and the substrate 10, such as a buffer layer 03 between the substrate 10 and the active layer 70, insulating layers between the film layers where the gate TG of the thin film transistor T, the active part TP of the thin film transistor T, and the source TS/drain TD of the thin film transistor T are located, a passivation layer 04 on a side of the film layer where the source TS/drain TD of the thin film transistor T are located away from the substrate 10, etc. The present disclosure does not specifically limit the setting structure of the insulating film layers between the pad group 20 and the substrate 10, as long as the insulating layer 02 covering the first metal elements 401 and/or the second metal elements 402 under the pad group 20 is the organic layer with a high flatness to weaken the height difference between the first metal elements 401 and/or the second metal elements 402 as much as possible.

Figure 32:
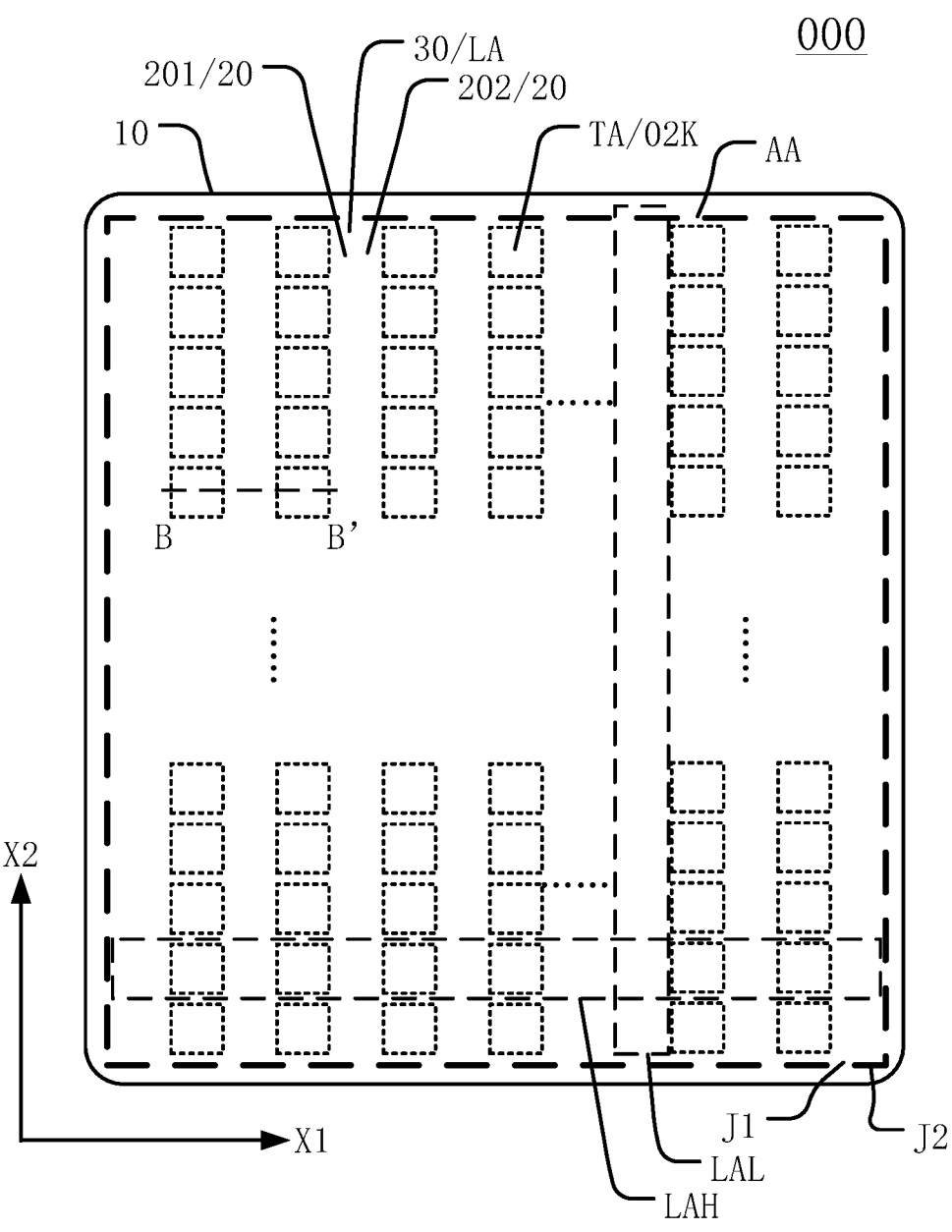
FIG. 32 illustrates a planar structure of another exemplary display panel consistent with various disclosed embodiments in the present disclosure.

In some embodiments, as shown in FIG. 31 and FIG. 32 which is another schematic planar view of the display panel (it can be understood that, to clearly illustrate the structure of this embodiment, FIG. 32 is filled with transparency), the plurality of light-transmitting regions TA are arranged along the first direction X1. There may be one pad group 20 along the first direction XA between two adjacent light-transmitting regions TA, and the first pad 201 and the second pad 202 in the pad group 20 may be arranged along the first direction X1.

In the present embodiment, the display panel 000 may be a transparent display panel, and the display region of the display panel 000 may include a transparent display region AA. The transparent display region AA may include a plurality of light-emitting regions LA and a plurality of light-transmitting regions TA. In the direction parallel to the plane where the substrate 10 is located, the plurality of light-transmitting regions TA is disposed adjacent to the plurality of light-emitting regions LA, and the transmittance of the plurality of light-transmitting regions TA may be larger than the transmittance of the plurality of light-emitting regions LA, to achieve the transparent display of the display panel 000. The plurality of light-transmitting regions TA may be arranged along the first direction X1. There may be one pad group 20 along the first direction XA between two adjacent light-transmitting regions TA, and the first pad 201 and the second pad 202 in the pad group 20 may be arranged along the first direction X1. The first metal elements 401 under the first pad 201 may be a part of a metal wire J1 extending along the second direction X2 or may be an independent metal structure. The second metal elements 402 under the disk 202 may be a part of another metal wire J2 extending along the second direction X2 or may be an independent metal structure, which is not limited in this embodiment. In the present disclosure, the distance from the first pad 201 to the corresponding closest through hole 02K and the distance from the second pad 202 to the corresponding closest through hole 02K may be set to be substantially equal, to reduce the height difference between the first pad 201 and the second pad 202 and improve the bonding yield of the light-emitting device 30.

Figure 33:
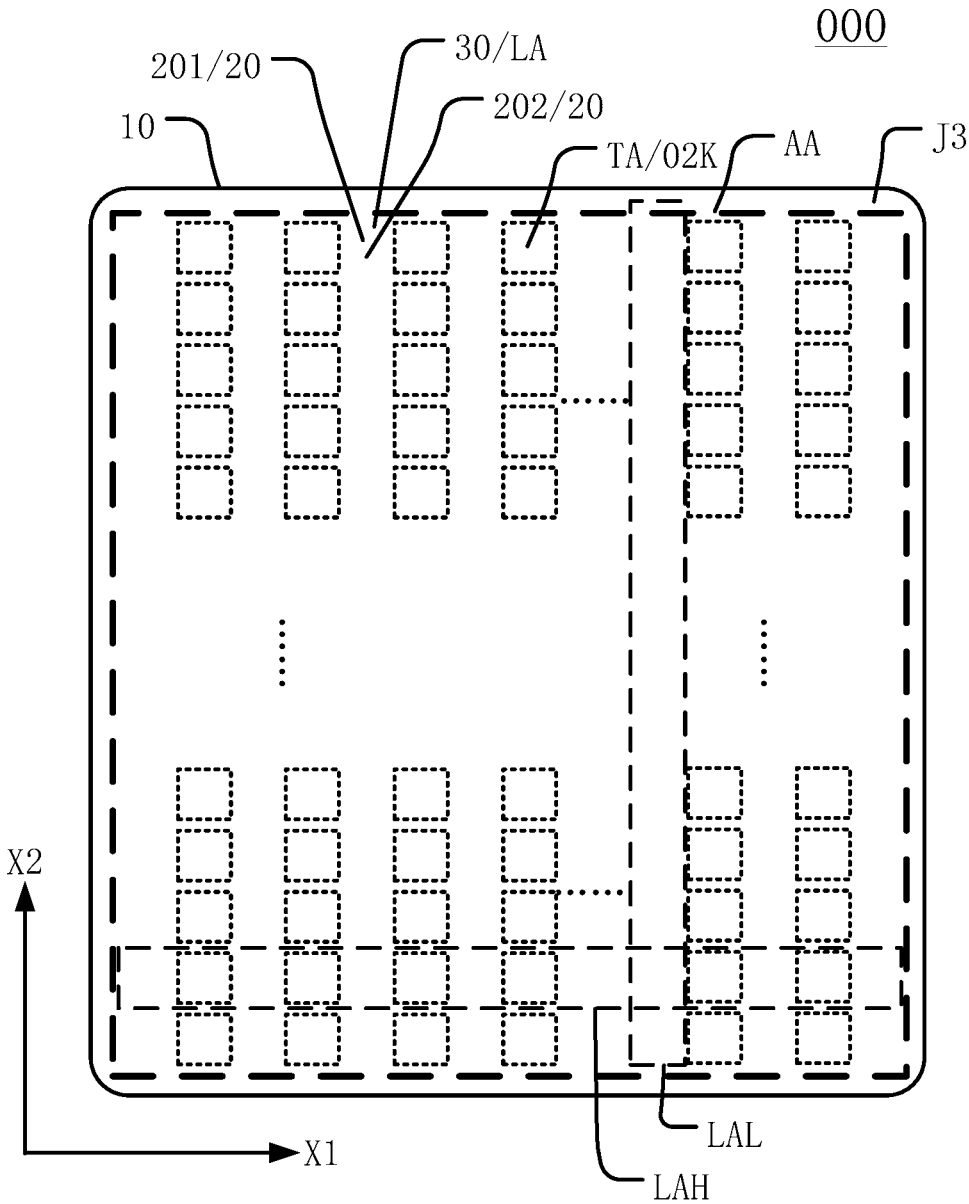
FIG. 33 illustrates a planar structure of another exemplary display panel consistent with various disclosed embodiments in the present disclosure.

In some embodiments, as shown in FIG. 33 which is another schematic planar view of the display panel (it can be understood that, to clearly illustrate the structure of this embodiment, FIG. 33 is filled with transparency), the plurality of light-transmitting regions TA are arranged along the first direction X1. There may be one pad group 20 along the first direction XA between two adjacent light-transmitting regions TA, and the first pad 201 and the second pad 202 in the pad group 20 may be arranged along the second direction X2.

In the present embodiment, the display panel 000 may be a transparent display panel, and the display region of the display panel 000 may include a transparent display region AA. The transparent display region AA may include a plurality of light-emitting regions LA and a plurality of light-transmitting regions TA. In the direction parallel to the plane where the substrate 10 is located, the plurality of light-transmitting regions TA is disposed adjacent to the plurality of light-emitting regions LA, and the transmittance of the plurality of light-transmitting regions TA may be larger than the transmittance of the plurality of light-emitting regions LA, to achieve the transparent display of the display panel 000. The plurality of light-transmitting regions TA may be arranged along the first direction X1. There may be one pad group 20 along the first direction XA between two adjacent light-transmitting regions TA. The first pad 201 and the second pad 202 in the pad group 20 may be arranged along the second direction X2, which is different from the arrangement of the plurality of light-transmitting regions TA. Therefore, the first pad 201 and the second pad 202 of the same pad group 20 may be located in the middle position of the lower wire stack as much as possible, and the first pad 201 and the second pad 201 of the same pad group 20 may be located at the same level as much as possible. The first metal elements 401 under the first pad 201 and the second metal elements 402 under the second pad 202 may be a part of a metal wire J3 extending along the second direction X2. In another embodiment, the first metal elements 401 under the first pad 201 and the second metal elements 402 under the second pad 202 may be independent metal structures, and the metal structures may be arranged along the second direction X2. In the present disclosure, the first pad 201 and the second pad 202 of the same pad group 20 may be centrally arranged above the same metal wire, to reduce the height difference between the first pad 201 and the second pad 202 and improve the bonding yield of the light-emitting device 30.

Figure 34:
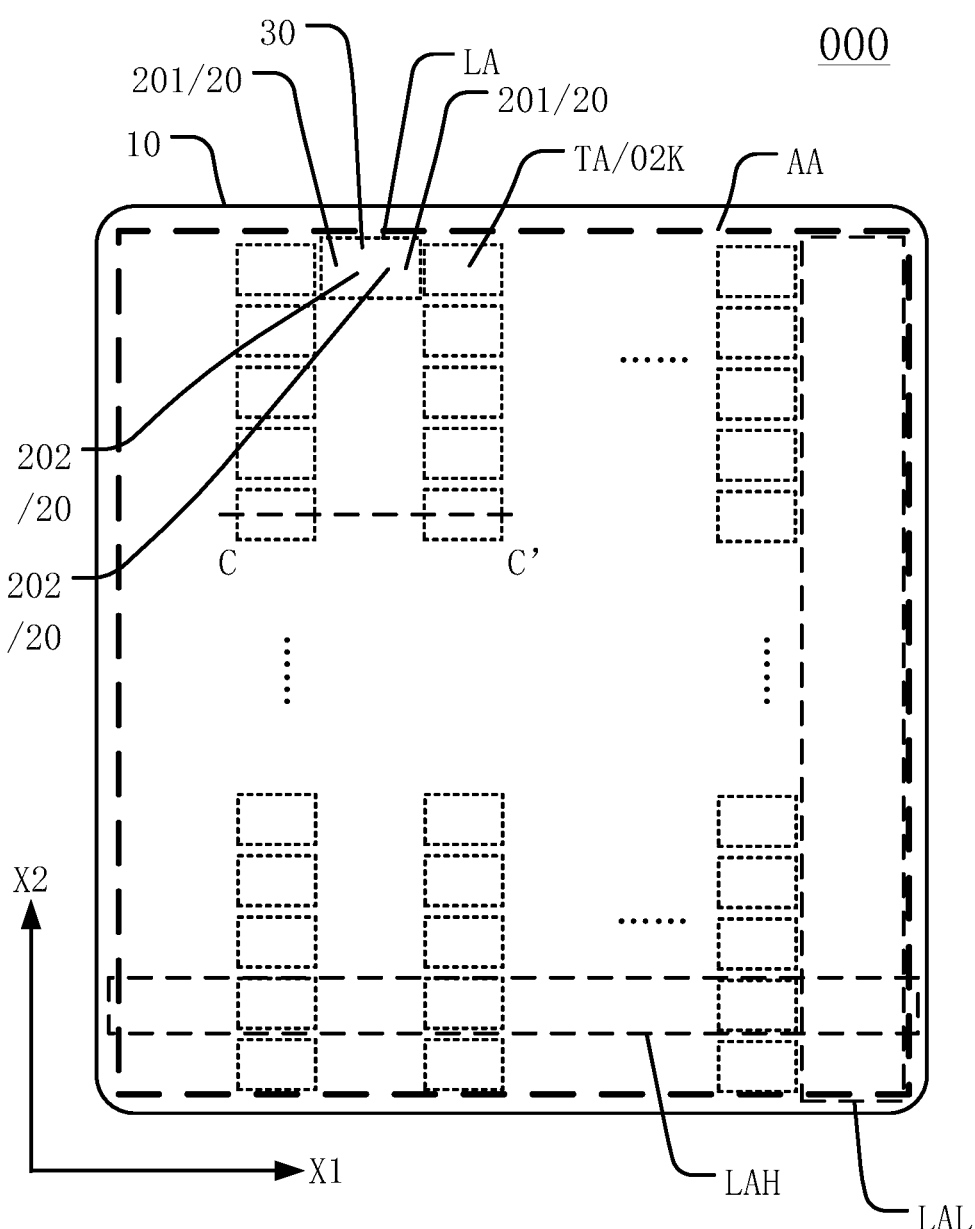
FIG. 34 illustrates a planar structure of another exemplary display panel consistent with various disclosed embodiments in the present disclosure.
Figure 35:
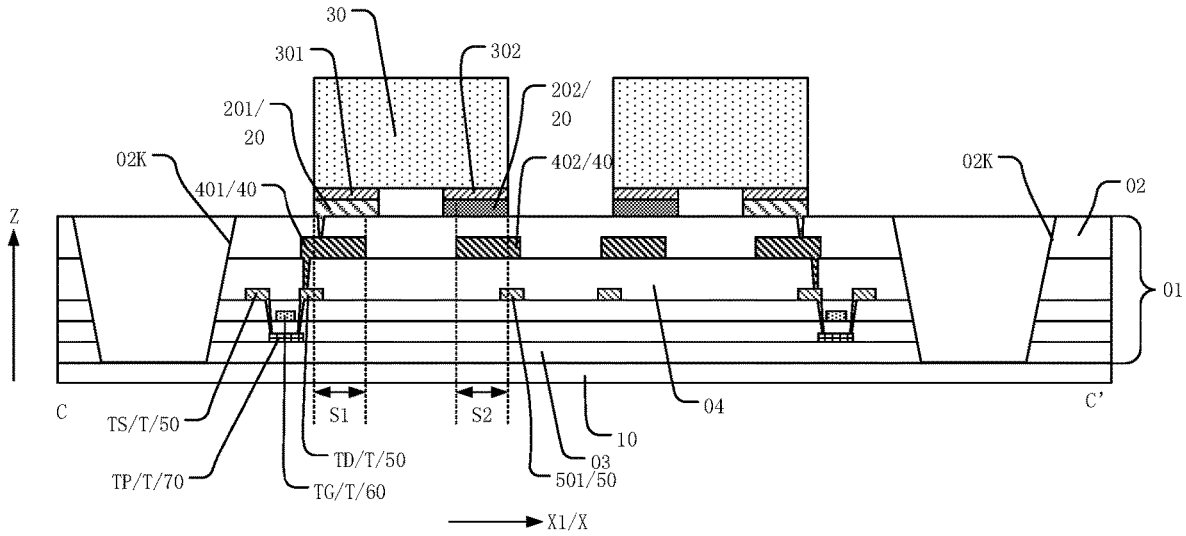
FIG. 35 illustrates another cross-sectional view of the display panel in FIG. 34 along a C-C' direction.

In another embodiment as shown in FIG. 34 which is another planar structure of the display panel and FIG. 35 which is a cross-sectional view of the display panel along a C-C' direction in FIG. 34 (to clearly illustrate the structure of the present embodiment, FIG. 34 is filled with transparency), the display panel 000 may further include a plurality of light-emitting regions LA and a plurality of light-transmitting regions TA. Each of the plurality of light-emitting regions LA may include at least two light-emitting devices 30. An orthographical projection of one of the plurality of pad groups 20 may be located in a corresponding one of the plurality of light-emitting regions LA.

The display panel 000 may further include thin film transistors T. A source TS or a drain TD of one thin film transistor T may be electrically connected to the first pad 201 in one corresponding pad group 20. In one pad group 20, the first pad 201 may be located at a side of the second pad 202 close to one corresponding light-transmitting region TA.

In the present embodiment, the display panel 000 may be a transparent display panel, and the display region of the display panel 000 may include a transparent display region AA. The transparent display region AA may include the plurality of light-emitting regions LA and the plurality of light-transmitting regions TA. In the direction parallel to the plane where the substrate 10 is located, the plurality of light-transmitting regions TA and the plurality of light-emitting regions LA may be arranged adjacent to each other. The transmittance of the plurality of light-transmitting regions TA may be larger than the transmittance of the plurality of light-emitting regions LA, to realize a transparent display effect of the display panel 000. One light-emitting region LA of the plurality of light-emitting regions LA may include at least two light-emitting devices 30. The embodiment shown in FIG. 34 and FIG. 35 where the light-emitting region LA includes two light-emitting devices 30 will be used as an example for illustration. The orthographic projection of one pad group 20 of the plurality of pad groups 20 on the substrate 10 may be located in the corresponding light-emitting region LA. Each of the two light-emitting devices 30 may correspond to at least one pad group 20. Optionally, the plurality of light-transmitting regions TA may be arranged along the first direction X1, and there may be at least two pad groups 20 between two adjacent light-transmitting regions TA along the first direction X1, and one light-emitting device 30 may correspond to at least one pad group 20. The display panel 000 may further include at least one insulating layer 02, and the at least one insulating layer 02 may be located on a side of the plurality of pad groups 20 close to the substrate 10. Optionally, one of the at least one insulating layer 02 may be an inorganic insulating layer 02 that plays an insulating role between the plurality of metal film layers. The insulating layer 02 may be provided with through holes 02K in the plurality of light-transmitting regions TA. Further optionally, when forming the display panel 000, the through holes 02K may be subsequently filled with a highly transparent material, to further improve the light transmittance of the plurality of light-transmitting regions TA of the display panel 000.

In the present disclosure, a driving circuit layer 01 may be provided between the substrate 10 and the plurality of pad groups 20, and the driving circuit layer 01 may include a plurality of thin film transistors T which is used to realize the electrical connection between the signal wiring and the light-emitting devices 30 in the display panel 000. Optionally, the source TS/drain TD of each thin film transistor T of the plurality of thin film transistors T may e electrically connected to the first pad 201 of one corresponding pad group 20, and the first pad 201 may be bonded and electrically connected to the first pin 301 of the corresponding light-emitting device 30. The first pin 301 may be understood as the anode pin of the light-emitting device 30. The second pad 202 may be bonded and electrically connected to the second pin 302 of the light-emitting device 30, and the second pin 302 may be understood as the cathode pin of the light-emitting device 30. Since the cathode pin may be connected to the same potential signal, the second pads 202 of the plurality of pad groups 20 in this embodiment may be electrically connected together, to provide a same signal, for example, a cathode signal, for the second pads 202 of the plurality of pad groups 20 in the display panel 000. In this embodiment, when one light-emitting region LA between two adjacent light-transmitting regions TA includes at least two light-emitting devices 30, the first pad 201 in one pad group 20 may be located at the side of the second pad 202 close to the light-transmitting region TA, that is, the first pad 201 bonded and electrically connected to the first pin 301 of the anode pin may be closer to the corresponding through hole 02K of the light-transmitting region TA. A large amount of metal structures (such as the conductive structures of the plurality of thin film transistors) may be necessary under the first pin 301 of the anode pin, and these metal structures may be used to fill the inclination of the film layers caused by the leveling difference of the film layers under the plurality of pad groups 20, to reduce the height difference between the first pad 201 and the second pad 202 in one same pad group 20 and improve the bonding yield of the light-emitting device 30.

Optionally, the first metal elements 401 and the second metal elements 402 in this embodiment may be arranged in the same layer, or the first metal elements 401 and the second metal elements 402 may also be arranged in different layers. The first pad 201 in one pad group 20 may correspond to a plurality of first metal elements 401, and the second pad 202 in one pad group may correspond to a plurality of second metal elements 402. For details, please refer to the description in the above embodiment. The arrangement of the first metal elements 401 and the second metal elements 402 may effectively reduce the inclination of the film layers caused by the leveling difference of the film layers under the pad group 20, thereby helping to ensure that the first pad 201 and the second pad 202 in one pad group 20 between the light-transmitting regions TA are on the same level as possible and ensure the bonding effect of the light-emitting device 30.

Figure 36:
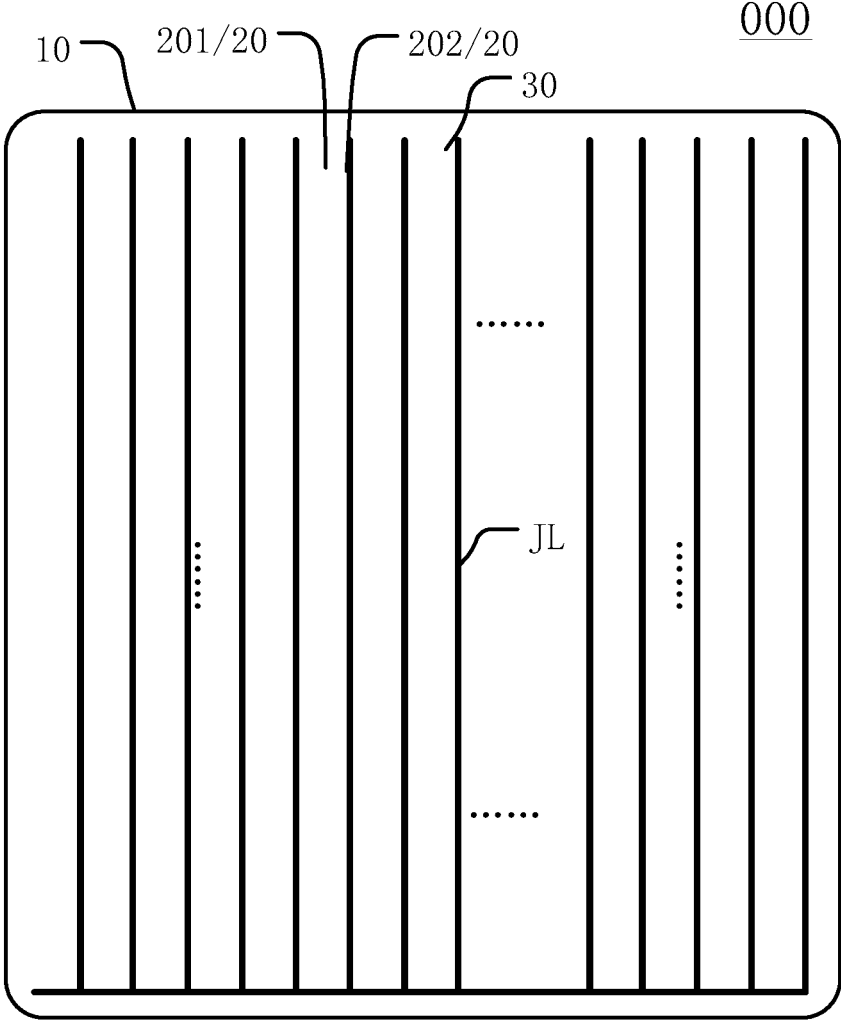
FIG. 36 illustrates a planar structure of another exemplary display panel consistent with various disclosed embodiments in the present disclosure.
Figure 37:
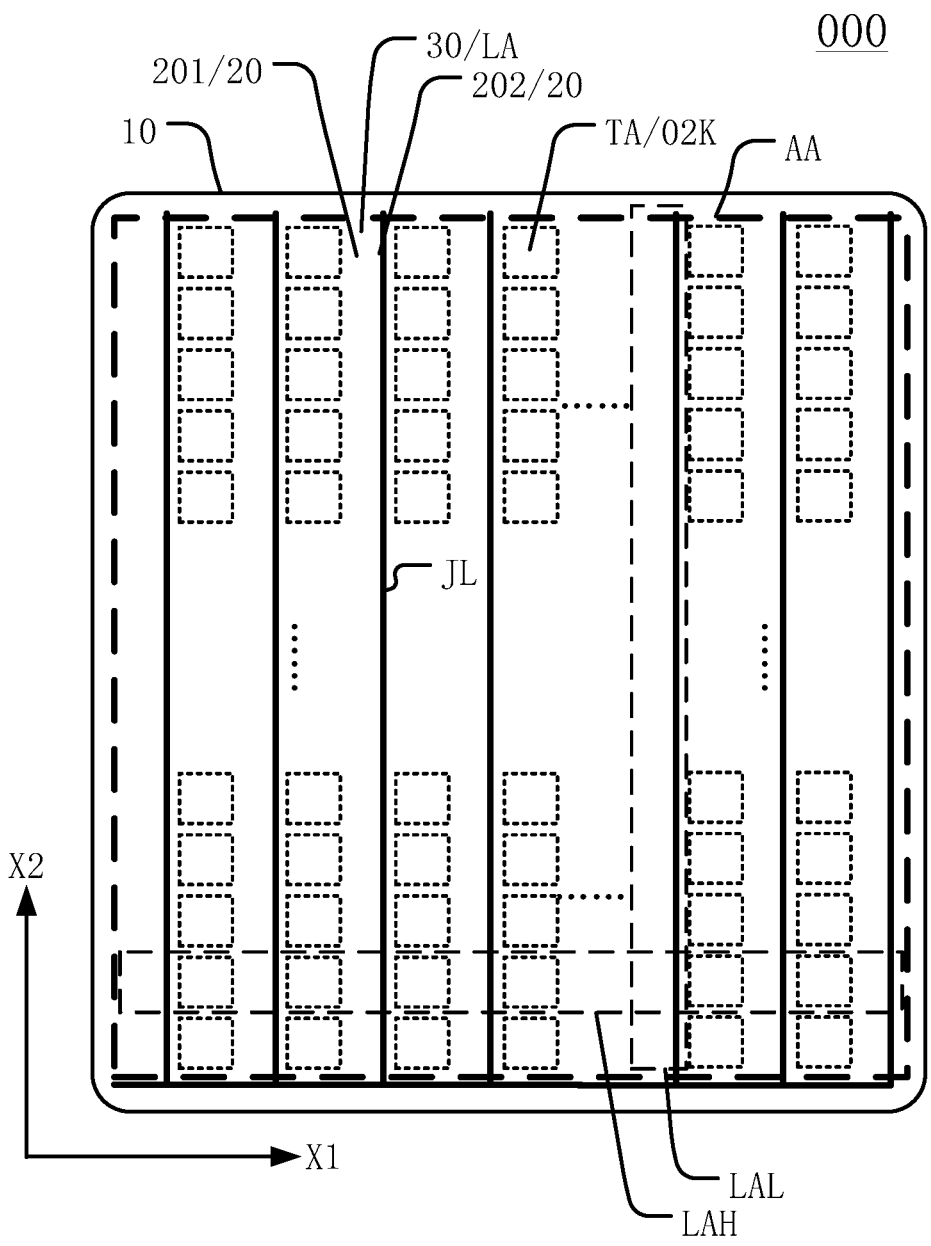
FIG. 37 illustrates a planar structure of another exemplary display panel consistent with various disclosed embodiments in the present disclosure.

In another embodiment as shown in FIG. 25, FIG. 36 which is another planar structure of the display panel and FIG. 37 which is another planar structure of the display panel (to clearly illustrate the structure of the present embodiment, FIG. 36 and FIG. 37 are filled with transparency), different first pads 201 of the plurality of pad groups 20 may be insulated from each other, and different second pads 202 of the plurality of pad groups 20 may be connected to each other through pad connection lines JL. The pad connection lines JL may be disposed in a layer same as the plurality of pad groups 20.

The first pin 301 of the light-emitting device 30 in this embodiment may be an anode pin, and may be electrically connected to the first pad 201. Since the first pin 301 may be understood as an anode pin of the light-emitting device 30, the plurality of first pads 201 of different pad groups 20 of the plurality of pad groups 20 may be insulated from each other, such that each light-emitting device 30 may be independently driven to emit light. The second pad 202 may be bonded and electrically connected to the second pin 302 of the light-emitting device 30. The second pin 302 may be understood as the cathode pin of the light-emitting device 30. Since the cathode pin may be connected to the same potential signal, the plurality of second pads 202 of different pad groups 20 may be electrically connected to each other through the pad connection lines JL, to realize that the plurality of second pads 202 in the display panel 000 share a common cathode signal. Optionally, since there may be less conductive structures in the film layer where the plurality of pad groups 20 is located, the pad connection lines JL may be disposed in the same film layer as the plurality of pad groups 20. Therefore, the pad connection lines JL may be prevented from being disposed in the driving circuit layer 01 and occupying space, to save the wiring space in the driving circuit layer 01. Also, the connection difficulty between the second pads 202 and the pad connection lines JL may be reduced, to improve the process efficiency.

Optionally, as shown in FIG. 8, one pad group 20 of the plurality of pad groups 20 may include an electrode layer 20A and a eutectic layer 20B located on a side of the electrode layer 20A away from the substrate 10. The electrode layer 20A may include a first electrode 20A1 and a second electrode 20A2 made of a metal conductive material.

The eutectic layer 20B may be made of a eutectic material with a high melting point, such as a eutectic material including solder and silver or gold. An overlapping area of the eutectic layer 20B and the first electrode 20A1 of the electrode layer 20A may be understood as the area of the first pad 201 in this embodiment, and an overlapping area of the eutectic layer 20B and the second electrode 20A2 of the electrode layer 20A may be understood as the area of the second pad 202 in this embodiment. The pad connection lines JL may be disposed in the same layer as the electrode layer 20A in the film layer where the pad group 20 is located, that is, the pad connection lines JL may be made of a metal conductive material.

Figure 38:
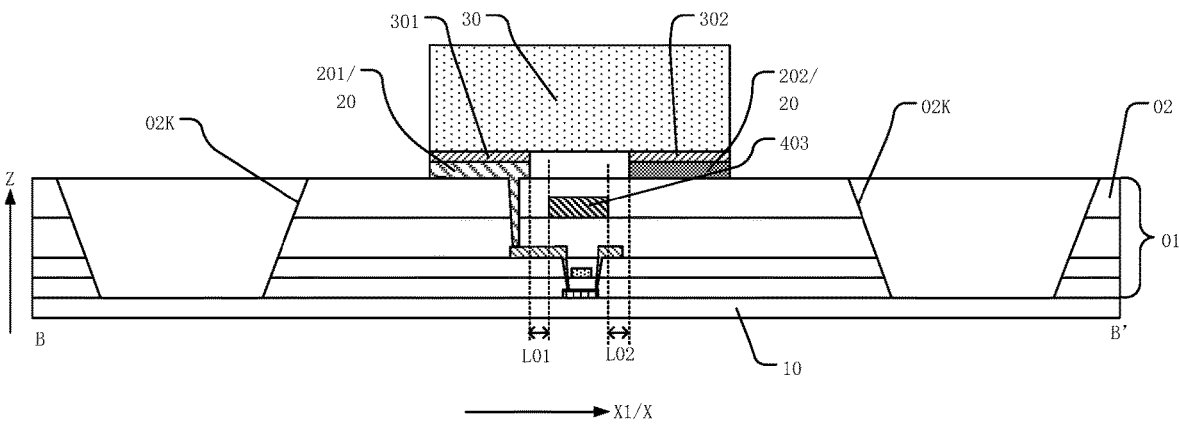
FIG. 38 illustrates another cross-sectional view of the display panel in FIG. 23 along a B-B' direction.

In some optional embodiments shown in FIG. 23 and FIG. 38 which is another cross-sectional structure in the direction B-B' in FIG. 23, a third metal element 403 may be disposed between two adjacent light-transmitting regions TA. In the direction Z perpendicular to the plane of the substrate 10, the third metal element 403 may overlap the first pad 201, and the third metal element 403 may not overlap the second pad 202.

In one pad group 20, an orthographic projection of the third metal element 403 on the substrate 10 may be located between the orthographic projection of the first pad 201 on the substrate and the orthographic projection of the second pad 202 on the substrate 10.

Along the direction from the first pad 201 to the second pad 202, the distance from the third metal element 403 to the first pad 201 may be equal to the distance from the third metal element 403 to the second pad 202.

In the present embodiment, the display panel 000 may be a transparent display panel. The display region of the display panel 000 may include a transparent display region AA, and the transparent display region AA may include a plurality of light-emitting regions LA and a plurality of light-transmitting regions TA. Along the direction parallel to the plane of the substrate 10, the plurality of light-transmitting regions TA may be arranged adjacent to the plurality of light-emitting regions LA, and the transmittance of the plurality of light-transmitting regions TA may be larger than the transmittance of the plurality of light-emitting regions LA, to achieve a transparent display effect of the display panel 000. One third metal element 403 may be disposed between two adjacent light-transmitting regions TA. In the direction Z perpendicular to the plane of the substrate 10, the third metal element 403 may overlap the first pad 201, and the third metal element 403 may not overlap the second pad 202. The orthographic projection of the third metal element 403 on the substrate 10 may be located between the orthographic projection of the first pad 201 on the substrate and the orthographic projection of the second pad 202 on the substrate 10. The third metal element 403 may be understood as the first metal elements 401 in the embodiment of FIG. 3, that is, in the direction Z perpendicular to the plane of the substrate 10, no metal structure may be provided directly under the first pad 201 and no metal structure is provided directly under the second pad 202. Along the direction from the first pad 201 to the second pad 202, the distance from the third metal element 403 to the first pad 201 may be equal to the distance from the third metal element 403 to the second pad 202 in one pad group 20. A distance L01 from an edge of the third metal element 403 facing the first pad 201 to the edge of the first pad 201 facing the third metal element 403, and a distance L02 from an edge of the third metal element 403 facing the second pad 202 to the edge of the second pad 202 facing the third metal element 403 may be equal or substantially equal. The third metal element 403 may be located at a relatively middle position between the two pads, and the third metal element 403 may be one or more different-layer metal structures, which are not specifically limited in this embodiment, to offset the flatness difference caused by the stacking difference of the underlying metal structures directly under the pad group 20. Therefore, in one pad group 20 corresponding to the light-emitting device 30, when there is no metal structure directly below the first pad 201 and the second pad 202 overlapping them, the first pad 201 and the second pad 202 may be prevented from having a height difference as much as possible in the direction Z perpendicular to the plane where the substrate 10 is located. The flatness of the first pad 201 and the second pad 202 in the pad group 20 and the product yield may be further improved.

Figure 39:
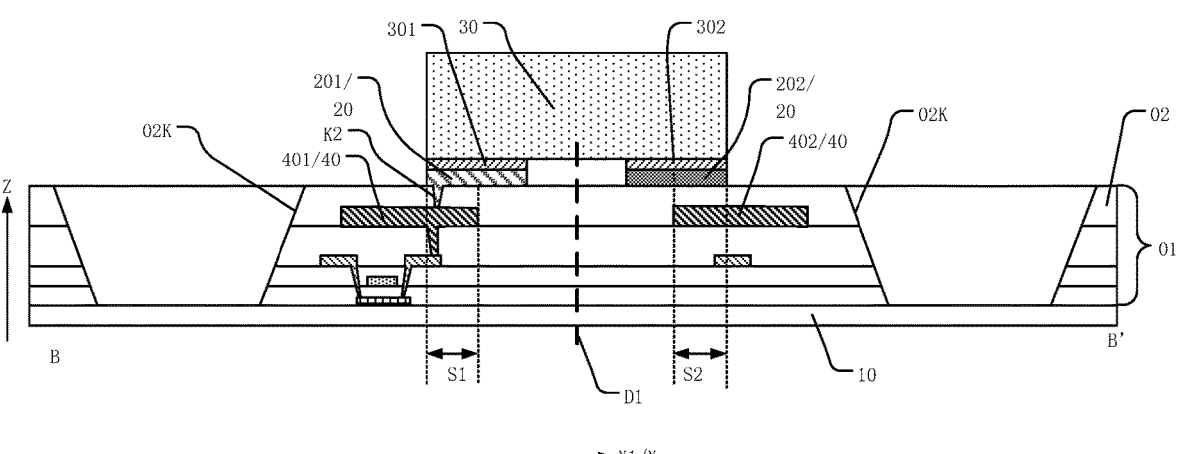
FIG. 39 illustrates another cross-sectional view of the display panel in FIG. 23 along a B-B' direction.

In some embodiments, as shown in FIG. 23 and FIG. 39 which is another schematic cross-sectional structure diagram along the direction B-B' in FIG. 23, one first metal elements 401 and one second metal elements 402 may be disposed between two adjacent light-transmitting regions TA.

In one pad group 20, the orthographic projection of the first metal elements 401 on the substrate 10 and the orthographic projection of the first pad 201 on the substrate 10 may at least partially overlap, and the orthographic projection of the second metal elements 402 on the substrate 10 and the orthographic projection of the second pad 202 on the substrate 10 may at least partially overlap.

In one pad group 20, the first pad 201 and the second pad 202 may have a symmetrical structure with respect to a first symmetry axis D1, and the first metal elements 401 and the second metal elements 402 may have a symmetrical structure with respect to the first symmetry axis D1.

In the present embodiment, the display panel 000 may be a transparent display panel. The display region of the display panel 000 may include a transparent display region AA, and the transparent display region AA may include a plurality of light-emitting regions LA and a plurality of light-transmitting regions TA. Along the direction parallel to the plane of the substrate 10, the plurality of light-transmitting regions TA may be arranged adjacent to the plurality of light-emitting regions LA, and the transmittance of the plurality of light-transmitting regions TA may be larger than the transmittance of the plurality of light-emitting regions LA, to achieve a transparent display effect of the display panel 000. One third metal element 403 may be disposed between two adjacent light-transmitting regions TA. One first metal elements 401 and one second metal elements 402 may be disposed between two adjacent light-transmitting regions TA. In one pad group 20, the orthographic projection of the first metal elements 401 on the substrate 10 and the orthographic projection of the first pad 201 on the substrate 10 may at least partially overlap, and the orthographic projection of the second metal elements 402 on the substrate 10 and the orthographic projection of the second pad 202 on the substrate 10 may at least partially overlap. That is, there may be one first metal elements 401 under the first pad 201, and one second metal elements 402 under the second pad 202. The first metal elements 401 and the second metal elements 402 may be arranged in the same film layer, to raise the first pad 201 and the second pad 202 respectively. The flatness may be ensured. In this embodiment, in one pad group 20, the first pad 201 and the second pad 202 may have a symmetrical structure with respect to a first symmetry axis D1, and the first metal elements 401 and the second metal elements 402 may have a symmetrical structure with respect to the first symmetry axis D1. Therefore, the area where the first pad 201 is raised by the first metal elements 401 may be basically the same as the area where the second metal elements 402 is raised on the second pad 202. The first pad 201 and the second pad 202 may be prevented from having the height difference in the direction Z perpendicular to the plane of the substrate 10 as much as possible. The flatness of the first pad 201 and the second pad 202 corresponding to the same light-emitting device 30 and the bonding yield may be improved.

Optionally, in one embodiment, the first metal elements 401 and the second metal elements 402 may have a symmetrical structure with respect to the first symmetry axis D1. The first metal elements 401 and the second metal elements 402 may be as close as possible to one corresponding through hole 02K closest to the first metal elements 401 and the second metal elements 402 respectively, to prevent the first metal elements 401 and the second metal elements 402 from gathering toward the center of the two adjacent light-transmitting regions TA at the same time. Therefore, the flatness of the first pad 201 and the second pad 202 may be further improved by placing the metal elements as close as possible to the correspondingly through holes 02K to solve the inclination of the film layers caused by the leveling difference of the film layers under the pad group 20.

Figure 40:
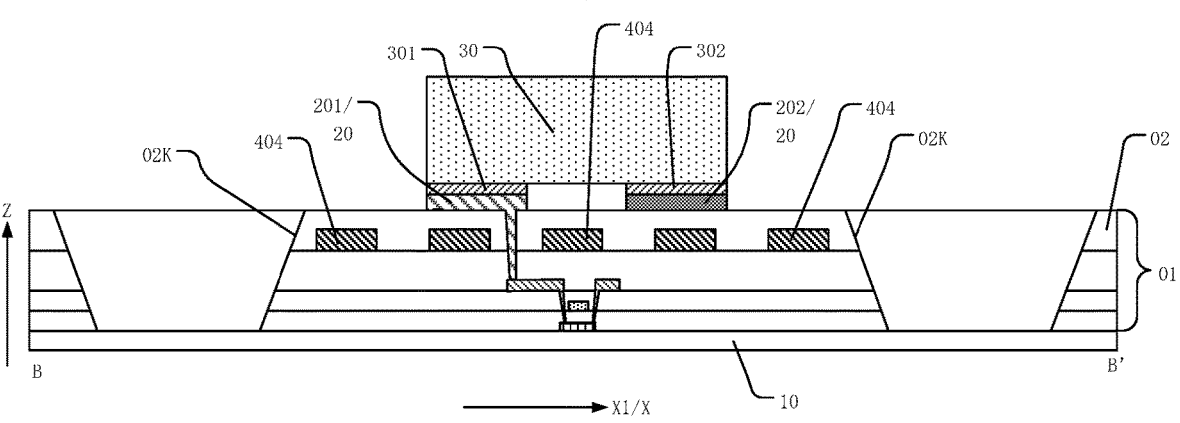
FIG. 40 illustrates another cross-sectional view of the display panel in FIG. 23 along a B-B' direction.

In some embodiments, as shown in FIG. 23 and FIG. 40 which is another schematic cross-sectional structure diagram along the direction B-B' in FIG. 23, a plurality of fourth metal elements 404 may be disposed between two adjacent light-transmitting regions TA. Along the direction from the first pad 201 to the second pad 202, the plurality of fourth metal elements 404 may be evenly arranged, that is, the distance between two adjacent fourth metal elements 404 may be substantially equal.

In the present embodiment, the display panel 000 may be a transparent display panel. The display region of the display panel 000 may include a transparent display region AA, and the transparent display region AA may include a plurality of light-emitting regions LA and a plurality of light-transmitting regions TA. Along the direction parallel to the plane of the substrate 10, the plurality of light-transmitting regions TA may be arranged adjacent to the plurality of light-emitting regions LA, and the transmittance of the plurality of light-transmitting regions TA may be larger than the transmittance of the plurality of light-emitting regions LA, to achieve a transparent display effect of the display panel 000. The plurality of fourth metal elements 404 may be disposed between two adjacent light-transmitting regions TA. Along the direction from the first pad 201 to the second pad 202, the plurality of fourth metal elements 404 may be evenly arranged, that is, the distance between two adjacent fourth metal elements 404 may be substantially equal. Since the number of the plurality of fourth metal elements 404 between adjacent light-transmitting regions TA is large and the distance between two adjacent light-transmitting regions TA is constant, the distance between two adjacent fourth metal elements 404 may be relatively reduced. Correspondingly, the fluctuation of the level difference of the metal elements under the pad group 20 may be ignored. The plurality of fourth metal elements 404 may be evenly arranged, such that the plurality of fourth metal elements 404 between two adjacent light-transmitting regions TA may satisfy that the distance between two adjacent fourth metal elements 404 may be substantially equal. Therefore, the first pad 201 and the second pad 202 may be prevented from having the height difference in the direction Z perpendicular to the plane of the substrate 10 as much as possible. The flatness of the first pad 201 and the second pad 202 corresponding to the same light-emitting device 30 and the bonding yield may be improved.

For description purposes only, the embodiments shown in FIG. 40 where five fourth metal elements 404 are disposed between two adjacent light-transmitting regions TA are used as examples to illustrate the present disclosure, and do not limit the scope of the present disclosure. In various embodiments, the number of fourth metal elements 404 disposed between two adjacent light-transmitting regions TA may be other suitable values, such as 3 or 4 or other number, as long as the normal light emission of the plurality of light-emitting regions LA is not affected.

In some embodiments, as shown in FIG. 1, FIG. 2, FIG. 6, and FIG. 1 which is another schematic cross-sectional structure diagram along the direction D-D' in FIG. 1, each light-emitting device 30 may include at least a first-color light-emitting device 30A and a second-color light-emitting device 30B.

The first-color light-emitting device 30A may be a blue or green light-emitting device, and the second-color light-emitting device 30B may be a red light-emitting device.

In one pad group 20 corresponding to the first-color light-emitting device 30A, a number of the first metal elements 401 at least partially overlapping one first pad 201 is P. In one pad group 20 corresponding to the second-color light-emitting device 30B, a number of the first metal elements 401 at least partially overlapping one first pad 201 is Q. Q>P≥0, and P and Q may be integers.

In the present embodiment, in one pad group 20 corresponding to one same light-emitting device 30, in the direction Z perpendicular to the plane where the substrate 10 is located, the number of the first metal elements 401 in different layers and at least partially overlapping the first pad 201 may be equal to the number of the second metal elements 402 in different layers and at least partially overlapping the second pad 202. In one embodiment shown in FIG. 2, in different metal film layers, the number of the first metal elements at least partially overlapping the first pad 201 may be 1, and the number of the second metal elements 402 at least partially overlapping the second pad 202 may be also 1. In another embodiment shown in FIG. 6, in different metal film layers, the number of the first metal elements 401 in different layers and at least partially overlapping the first pad 201 may be 2, and the number of the second metal elements 402 in different layers and at least partially overlapping the second pad 202 may also be 2. The number of the first metal elements 401 in different layers and at least partially overlapping the first pad 201 may be equal to the number of the second metal elements 402 in different layers and at least partially overlapping the second pad 202. Therefore, the first pad 201 and the second pad 202 may be prevented from having the height difference in the direction Z perpendicular to the plane of the substrate 10 as much as possible. The flatness of the first pad 201 and the second pad 202 corresponding to the same light-emitting device 30 and the bonding yield may be improved.

Figure 41:
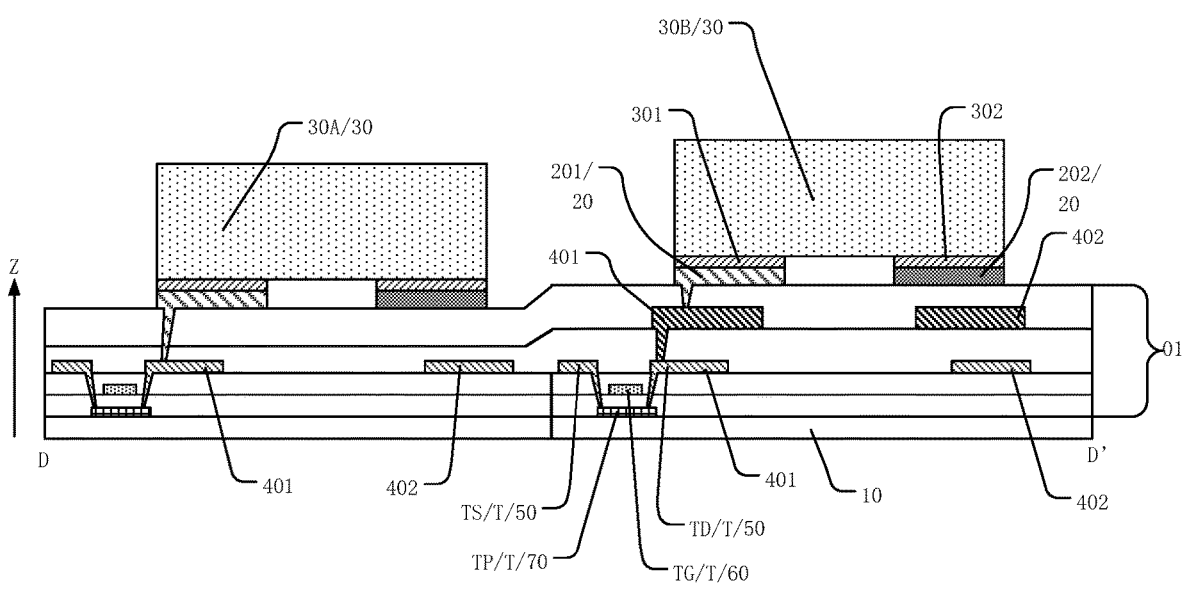
FIG. 41 illustrates another cross-sectional view of the display panel in FIG. 1 along a D-D' direction.

In the present embodiment, the number of first metal elements 401 in different layers corresponding to different pad groups 20 of light-emitting devices 30 with different colors may be different. Each light-emitting device 30 may include at least the first-color light-emitting device 30A and the second-color light-emitting device 30B. The first-color light-emitting device 30A may be a blue or green light-emitting device, and the second-color light-emitting device 30B may be a red light-emitting device. The luminous efficiency of the first color light-emitting device 30A may be higher, and the luminous efficiency of the second color light-emitting device 30B may be lower. In one pad group 20 corresponding to the first-color light-emitting device 30A with a higher light-emitting efficiency, a number of the first metal elements 401 at least partially overlapping one first pad 201 is P. In one pad group 20 corresponding to the second-color light-emitting device 30B with a lower light-emitting efficiency, a number of the first metal elements 401 at least partially overlapping one first pad 201 is Q. Q>P≥0. In one embodiment shown in FIG. 41, P may be 1 and Q may be 2. Therefore, there may be more metal structures under the second-color light-emitting device 30B with a lower light-emitting efficiency to raise the second-color light-emitting device 30B. In the packaged display panel 000, the second-color light-emitting device 30B with a lower light-emitting efficiency may be closer to the light-emitting surface of the display panel 000, such that the light-emitting brightness of the first-color light-emitting device 30A and the second-color light-emitting device 30B on the light-emitting surface of the display panel 000 may be same as much as possible to improve the brightness uniformity of the entire display panel 000.

Figure 42:
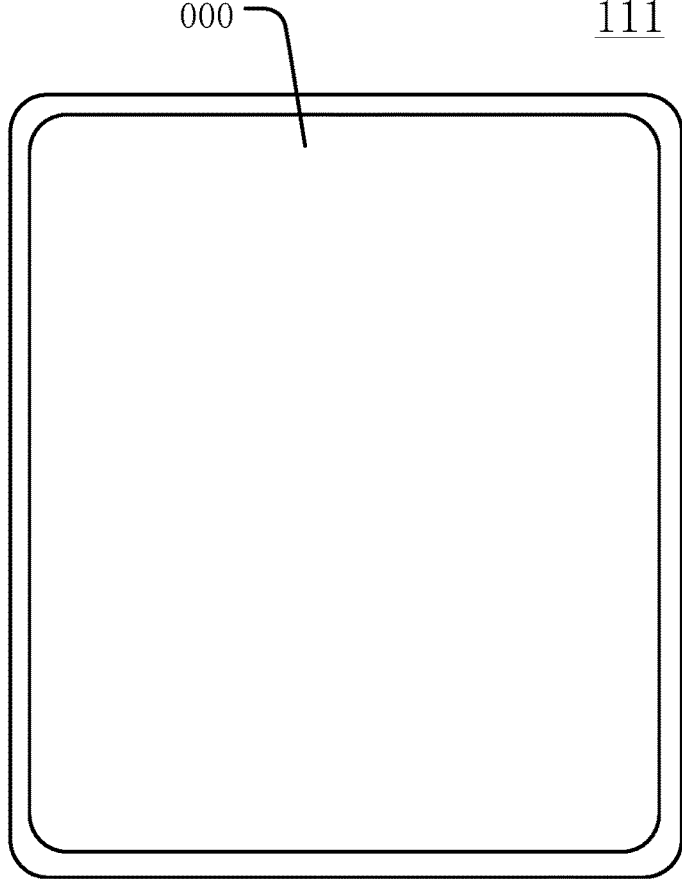
FIG. 42 illustrates a planar structure of an exemplary display device consistent with various disclosed embodiments in the present disclosure.

The present disclosure also provides a display device. In one embodiment shown in FIG. 42, the display device 111 may include a display panel 000 provided by various embodiments of the present disclosure. For description purposes only, the embodiment shown in FIG. 42 where the display device is a cell phone is used as an example to illustrate the present disclosure, and does not limit the scope of the present disclosure. In various embodiments, the display device 111 may be a display device with a display function such a computer, a television, or an in-vehicle display device. The detail and the advantages of the display device 111 may be made reference to the above embodiments about the display panel 000.

In the display panel and the display device provided by the present disclosure, the display panel may include the substrate. The substrate may be used as a carrier base of the display panel, and other structures of the display panel may be formed on the substrate. The plurality of pad groups may be disposed on one side of the substrate. A least one pad group may be arranged corresponding to a light-emitting device. The light-emitting devices may be bonded and arranged above the plurality of pad groups. On pad group may include one first pad and one second pad. The display panel may further include the first metal elements and the second metal elements at the side of the plurality of pad groups close to the substrate. In one pad group corresponding to one same light-emitting device, there may be one first metal elements directly under the first pad, and one second metal elements directly under the second pad. The overlapping area of the first pad and the first metal elements may be basically equal to the overlapping area of the second pad and the second metal element, satisfying (|S1−S2|)/S1≤5%. Therefore, the first pad and the second pad may be basically kept on the same level, and the height difference between the first pad and the second pad in the direction perpendicular to the plane of the substrate may be avoided as much as possible. The flatness of the first pad and the second pad corresponding to the same light-emitting device may be improved. Or, the first metal elements may be not set directly under the first pad, and the second metal elements may be not set directly under the second pad. There may be no metal elements under the first pad and the second pad corresponding to one pad group to destroy the flatness. Therefore, when the subsequent light-emitting device is bonded to the corresponding pad group, the problem where there is a metal elements directly under one pad to raise the film layer but no metal elements under another pad, resulted poor flatness of the pad group before the light-emitting device is bonded, virtual soldering or poor contact between the light-emitting device and the pad group may be avoided. The first pad and the second pad may be prevented from having the height difference in the direction perpendicular to the plane of the substrate, to ensure the stability of the electrical connection when the light-emitting device is bonded to the first pad and the second pad in the corresponding pad group. The binding yield, the product yield, and the display quality may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:

a substrate;

light-emitting devices;

a plurality of pad groups on a side of the substrate, wherein each of the plurality of pad groups includes a first pad and a second pad, and at least one pad group of the plurality of pad groups corresponds to one light-emitting device;

a driving circuit layer disposed between the substrate and the plurality of pad groups;

one or more first metal elements and one or more second metal elements disposed in the driving circuit layer at a side of the plurality of pad groups close to the substrate;

a plurality of light-emitting regions;

a plurality of light-transmitting regions; and at least one insulating layer, wherein:

in one pad group of the plurality of pad groups corresponding to one same light-emitting device, along a direction perpendicular to a plane of the substrate, the first pad at least partially overlaps the one or more first metal elements, the second pad at least partially overlaps the one or more second metal elements, an overlapping area of the first pad and the one or more first metal elements is S1, and an overlapping area of the second pad and the one or more second metal elements is S2, wherein $|S1-S2|/S1 \leq 5\%$;

or in one pad group of the plurality of pad groups corresponding to one same light-emitting device, along the direction perpendicular to the plane of the substrate, the first pad does not overlap the one or more first metal elements, and the second pad does not overlap the one or more second metal elements;

each light-emitting region of the plurality of light-emitting regions includes at least one light-emitting device;

an orthographical projection of one pad group of the plurality of pad groups on the substrate is located in a corresponding one of the plurality of light-emitting regions;

the at least one insulating layer is disposed on the side of the plurality of pad groups close to the substrate, and includes through holes in the plurality of light-transmitting regions;

in one pad group of the plurality of pad groups, along a direction parallel to the plane of the substrate, a minimum distance from the first pad to one corresponding through hole is W1, and a minimum distance from the second pad to one corresponding through hole is W2, wherein $|W1-W2| \leq 1.1$ µm;

each light-emitting device includes at least a first-color light-emitting device and a second-color light-emitting device;

the first-color light-emitting device is a blue or green light-emitting device, and the second-color light-emitting device is a red light-emitting device;

in one of the plurality of pad groups corresponding to the first color light-emitting device, a number of the one or more first metal elements at least partially overlapping the first pad is P;

in one of the plurality of pad groups corresponding to the second color light-emitting device, a number of the one or more first metal elements at least partially overlapping the first pad is Q; and $Q > P \geq 0$, and P and Q are integers.

2. The display panel according to claim 1, wherein the one or more first metal elements and the one or more second metal elements are disposed in a same layer.

3. The display panel according to claim 2, wherein:

the display panel includes a first metal layer on the side of the plurality of pad groups close the substrate;

the one or more first metal elements and the one or more second metal elements are disposed in the first metal layer; and there are no other metal layers between the first metal layer and the plurality of pad groups.

4. The display panel according to claim 1, further including a thin film transistor array layer on the side of the plurality of pad groups close to the substrate, wherein:

the thin film transistor array layer includes a plurality of thin film transistors;

the thin film transistor array layer includes a second metal layer;

sources and/or drains of the plurality of thin film transistors are located in the second metal layer; and the second metal layer is located on a side of the one or more first metal elements and/or the one or more second metal elements facing the substrate, or the one or more first metal elements and/or the one or more second metal elements are located in the second metal layer.

5. The display panel according to claim 4, wherein:

in one pad group corresponding to one same light-emitting device, along the direction perpendicular to the plane of the substrate, a number of the one or more first metal elements at least partially overlapping the first pad is M, and a number of the one or more second metal elements at least partially overlapping the second pad is N, wherein M=N, and M and N are integers larger than or equal to 0.

6. The display panel according to claim 1, wherein:

in one pad group of the plurality of pad groups, along the direction perpendicular to the plane of the substrate, a minimum distance from the first pad to the substrate is equal to a minimum distance from the second pad to the substrate.

7. The display panel according to claim 1, wherein $W1 \geq 7.5$ μm, $W2 \geq 7.5$ μm.

8. The display panel according to claim 1, wherein:

in one pad group of the plurality of pad groups, along the direction parallel to the plane of the substrate, a minimum distance from the one or more first metal elements to one corresponding through hole is W3, and a minimum distance from the one or more second metal elements to one corresponding through hole is W4, wherein $|W3-W4| \leq 1.1$ μm.

9. The display panel according to claim 1, wherein:

the at least one insulating layer is an organic layer on the side of the one or more first metal elements and/or the one or more second metal elements close to the plurality of pad groups;

the organic layer is in direct contact with the one or more first metal elements and/or the one or more second metal elements.

10. The display panel according to claim 1, wherein:

the plurality of the light-transmitting regions is arranged along a first direction;

one pad group of the plurality of pad groups is disposed between two adjacent light-transmitting regions of the plurality of the light-transmitting regions along the first direction; and in one pad group of the plurality of pad groups, the first pad and the second pad are arranged along the first direction.

11. The display panel according to claim 1, further including thin film transistors, wherein:

each light-emitting region of the plurality of light-emitting regions includes at least two light-emitting devices;

sources/drains of the thin film transistors are electrically connected to the first pads in the plurality of pad groups; and in one pad group of the plurality of pad groups, the first pad is located at a side of the second pad close to a corresponding one of the plurality of light-transmitting regions.

12. The display panel according to claim 11, wherein:

the plurality of the light-transmitting regions is arranged along a first direction; and at least two pad group of the plurality of pad groups are disposed between two adjacent light-transmitting regions of the plurality of the light-transmitting regions along the first direction.

13. The display panel according to claim 1, wherein:

a third metal element is disposed between two adjacent light-transmitting regions of the plurality of the light-transmitting regions;

in the direction perpendicular to the plane of the substrate, the third metal element does not overlap the first pad, and the third metal element does not overlap the second pad;

in one pad group of the plurality of pad groups, an orthographic projection of the third metal element on the substrate is located between the orthographic projection of the first pad on the substrate and the orthographic projection of the second pad on the substrate; and along the direction from the first pad to the second pad, a distance from the third metal element to the first pad is equal to a distance from the third metal element to the second pad.

14. The display panel according to claim 1, wherein:

one first metal element and one second metal element are disposed between two adjacent light-transmitting regions of the plurality of the light-transmitting regions;

in one pad group of the plurality of pad groups, an orthographical projection of one first metal on the substrate part at least partially overlaps an orthographical projection of the first pad on the substrate, and an orthographical projection of one second metal element on the substrate at least partially overlaps an orthographical projection of the second pad on the substrate; and in one pad group of the plurality of pad groups, the first pad and the second pad have a symmetrical structure with respect to a first symmetric axis, and the one or more first metal elements and the one or more second metal elements have a symmetrical structure with respect to the first symmetric axis.

15. The display panel according to claim 1, wherein:

one pad group of the plurality of pad groups includes an electrode layer and a eutectic layer on a side of the electrode layer away from the substrate; and an overlapping region of the eutectic layer and the electrode layer is the first pad or the second pad.

16. A display device, comprising a display panel, wherein:

the display panel includes:

a substrate;

light-emitting devices;

a plurality of pad groups on a side of the substrate, wherein each of the plurality of pad groups includes a first pad and a second pad, and at least one pad group of the plurality of pad groups corresponds to one light-emitting device;

a driving circuit layer disposed between the substrate and the plurality of pad groups;

one or more first metal elements and one or more second metal elements disposed in the driving circuit layer at a side of the plurality of pad groups close to the substrate;

a plurality of light-emitting regions;

a plurality of light-transmitting regions; and at least one insulating layer, wherein:

in one pad group of the plurality of pad groups corresponding to one same light-emitting device, along a direction perpendicular to a plane of the substrate, the first pad at least partially overlaps the one or more first metal elements, the second pad at least partially overlaps the one or more second metal elements, an overlapping area of the first pad and the one or more first metal elements is S1, and an overlapping area of the second pad and the one or more second metal elements is S2, wherein $|S1-S2|/S1 \leq 5\%$; or in one pad group of the plurality of pad groups corresponding to one same light-emitting device, along the direction perpendicular to the plane of the substrate, the first pad does not overlap the one or more first metal elements, and the second pad does not overlap the one or more second metal elements;

each light-emitting region of the plurality of light-emitting regions includes at least one light-emitting device;

an orthographical projection of one pad group of the plurality of pad groups on the substrate is located in a corresponding one of the plurality of light-emitting regions;

the at least one insulating layer is disposed on the side of the plurality of pad groups close to the substrate, and includes through holes in the plurality of light-transmitting regions;

in one pad group of the plurality of pad groups, along a direction parallel to the plane of the substrate, a minimum distance from the first pad to one corresponding through hole is W1, and a minimum distance from the second pad to one corresponding through hole is W2, wherein $|W1-W2| \le 1.1$ μm;

each light-emitting device includes at least a first-color light-emitting device and a second-color light-emitting device;

the first-color light-emitting device is a blue or green light-emitting device, and the second-color light-emitting device is a red light-emitting device;

in one of the plurality of pad groups corresponding to the first color light-emitting device, a number of the one or more first metal elements at least partially overlapping the first pad is P;

in one of the plurality of pad groups corresponding to the second color light-emitting device, a number of the one or more first metal elements at least partially overlapping the first pad is Q; and $Q>P \ge 0$, and P and Q are integers.

17. A display panel, comprising:

a substrate;

light-emitting devices;

a plurality of pad groups on a side of the substrate, wherein each of the plurality of pad groups includes a first pad and a second pad, and at least one pad group of the plurality of pad groups corresponds to one light-emitting device;

a driving circuit layer disposed between the substrate and the plurality of pad groups; and one or more first metal elements and one or more second metal elements disposed in the driving circuit layer at a side of the plurality of pad groups close to the substrate, wherein:

in one pad group of the plurality of pad groups corresponding to one same light-emitting device, the light-emitting device includes a first pin and a second pin, the first pin being bonded and electrically connected to the first pad, and the second pin being bonded and electrically connected to the second pad;

in one pad group of the plurality of pad groups corresponding to one same light-emitting device, along a direction perpendicular to a plane of the substrate, the first pad at least partially overlaps the one or more first metal elements, the second pad at least partially overlaps the one or more second metal elements, an overlapping area of the first pad and the one or more first metal elements is S1, and an overlapping area of the second pad and the one or more second metal elements is S2, wherein $|S1-S2|/S1 \le 5\%$;

or in one pad group of the plurality of pad groups corresponding to one same light-emitting device, along the direction perpendicular to the plane of the substrate, the first pad does not overlap the one or more first metal elements, and the second pad does not overlap the one or more second metal elements;

each light-emitting device includes at least a first-color light-emitting device and a second-color light-emitting device;

the first-color light-emitting device is a blue or green light-emitting device, and the second-color light-emitting device is a red light-emitting device;

in one of the plurality of pad groups corresponding to the first color light-emitting device, a number of the one or more first metal elements at least partially overlapping the first pad is P;

in one of the plurality of pad groups corresponding to the second color light-emitting device, a number of the one or more first metal elements at least partially overlapping the first pad is Q; and $Q>P \ge 0$, and P and Q are integers.

18. A display device comprising the display panel of claim 17.

* * * * *